(12) United States Patent
Cardwell et al.

(10) Patent No.: US 11,393,743 B2
(45) Date of Patent: Jul. 19, 2022

(54) SEMICONDUCTOR ASSEMBLY WITH CONDUCTIVE FRAME FOR I/O STANDOFF AND THERMAL DISSIPATION

(71) Applicant: Infineon Technologies AG, Neubiberg (DE)

(72) Inventors: Stuart Cardwell, Crowborough (GB); Chee Yang Ng, Muar Johor (MY); Josef Maerz, Oberhaching (DE); Clive O'Dell, Horley (GB); Mark Pavier, Felbridge (GB)

(73) Assignee: Infineon Technologies AG, Neubiberg (DE)

( * ) Notice: Subject to any disclaimer, the term of this patent is extended or adjusted under 35 U.S.C. 154(b) by 51 days.

(21) Appl. No.: 16/718,443

(22) Filed: Dec. 18, 2019

(65) Prior Publication Data

US 2021/0193560 A1 Jun. 24, 2021

(51) Int. Cl.
*H01L 23/495* (2006.01)
*H01L 23/34* (2006.01)
*H01L 21/00* (2006.01)
*H01L 21/44* (2006.01)
*H05K 7/18* (2006.01)
(Continued)

(52) U.S. Cl.
CPC ...... *H01L 23/4952* (2013.01); *H01L 23/3107* (2013.01); *H01L 23/49503* (2013.01); *H01L 23/49531* (2013.01); *H01L 23/49551* (2013.01); *H01L 23/49568* (2013.01); *H01L 23/49575* (2013.01); *H01L 23/5226* (2013.01);
(Continued)

(58) Field of Classification Search
CPC ........... H01L 23/4952; H01L 23/49503; H01L 23/49531; H01L 23/49575; H01L 23/5226; H01L 24/14; H01L 24/32; H01L 24/33; H01L 24/29; H01L 24/30; H01L 23/49568; H01L 23/3107; H01L 23/49551
See application file for complete search history.

(56) References Cited

U.S. PATENT DOCUMENTS 5,633,535 A 5/1997 Chao et al.
6,133,634 A * 10/2000 Joshi .................... B23K 1/0008
228/180.22

(Continued)

FOREIGN PATENT DOCUMENTS

CN 206497883 U 9/2017
CN 107863325 A 3/2018
(Continued)

*Primary Examiner* — Alonzo Chambliss
(74) *Attorney, Agent, or Firm* — Murphy, Bilak & Homiller, PLLC

(57) ABSTRACT

A semiconductor device includes a conductive frame comprising a die attach surface that is substantially planar, a semiconductor die comprising a first load on a rear surface and a second terminal disposed on a main surface, a first conductive contact structure disposed on the die attach surface, and a second conductive contact structure on the main surface. The first conductive contact structure vertically extends past a plane of the main surface of the semiconductor die. The first conductive contact structure is electrically isolated from the main surface of the semiconductor die by an electrical isolation structure. An upper surface of the electrical isolation structure is below the main surface of the semiconductor die.

20 Claims, 22 Drawing Sheets

(51) Int. Cl.
*H01L 23/00* (2006.01)
*H01L 23/522* (2006.01)
*H01L 23/31* (2006.01)

(52) U.S. Cl.
CPC .............. *H01L 24/14* (2013.01); *H01L 24/30* (2013.01); *H01L 24/32* (2013.01); *H01L 24/33* (2013.01)

(56) References Cited

U.S. PATENT DOCUMENTS

| | | | | |
|---|---|---|---|---|
| 7,439,613 | B2* | 10/2008 | Joshi | H01L 23/49562 257/678 |
| 2003/0052405 | A1* | 3/2003 | Moriguchi | H01L 23/49562 257/706 |
| 2008/0048342 | A1* | 2/2008 | Cheah | H01L 23/49575 257/777 |
| 2009/0042337 | A1* | 2/2009 | Landau | H01L 25/072 438/109 |
| 2009/0194856 | A1* | 8/2009 | Gomez | H01L 24/11 257/675 |
| 2010/0019381 | A1* | 1/2010 | Haeberlen | H01L 23/3121 257/737 |
| 2010/0157568 | A1* | 6/2010 | Ewe | H01L 23/49827 361/820 |
| 2011/0163440 | A1* | 7/2011 | Theuss | H01L 23/49816 257/737 |
| 2012/0205803 | A1 | 8/2012 | Sun et al. | |
| 2012/0248564 | A1* | 10/2012 | Hauenstein | H01L 23/34 257/467 |
| 2015/0084150 | A1 | 3/2015 | Pan et al. | |
| 2016/0093560 | A1* | 3/2016 | Huo | H01L 24/97 257/676 |
| 2017/0098626 | A1 | 4/2017 | Niu et al. | |
| 2019/0067232 | A1 | 2/2019 | Wirz et al. | |
| 2019/0237393 | A1 | 8/2019 | Wong | |

FOREIGN PATENT DOCUMENTS

| | | |
|---|---|---|
| EP | 2191507 B1 | 10/2018 |
| WO | 02061832 A1 | 8/2002 |

* cited by examiner

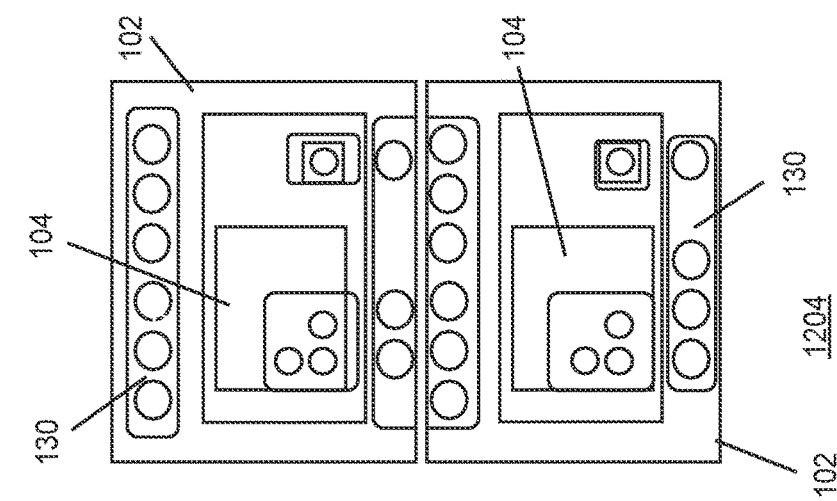
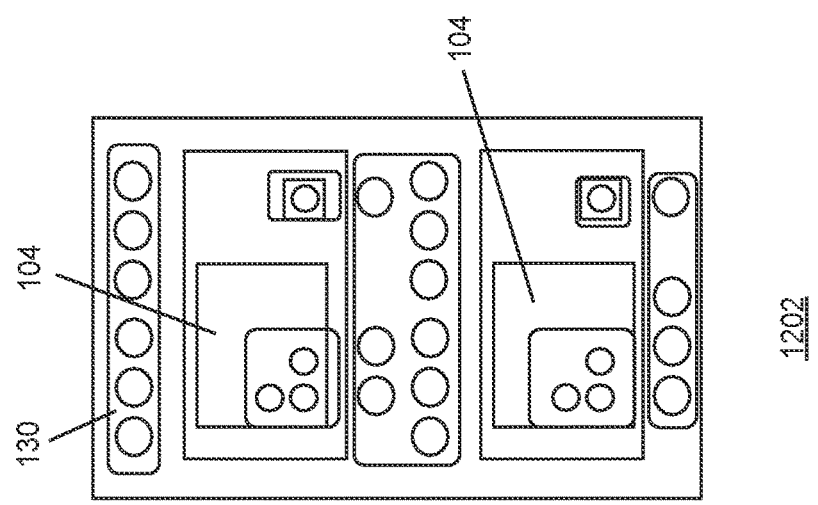
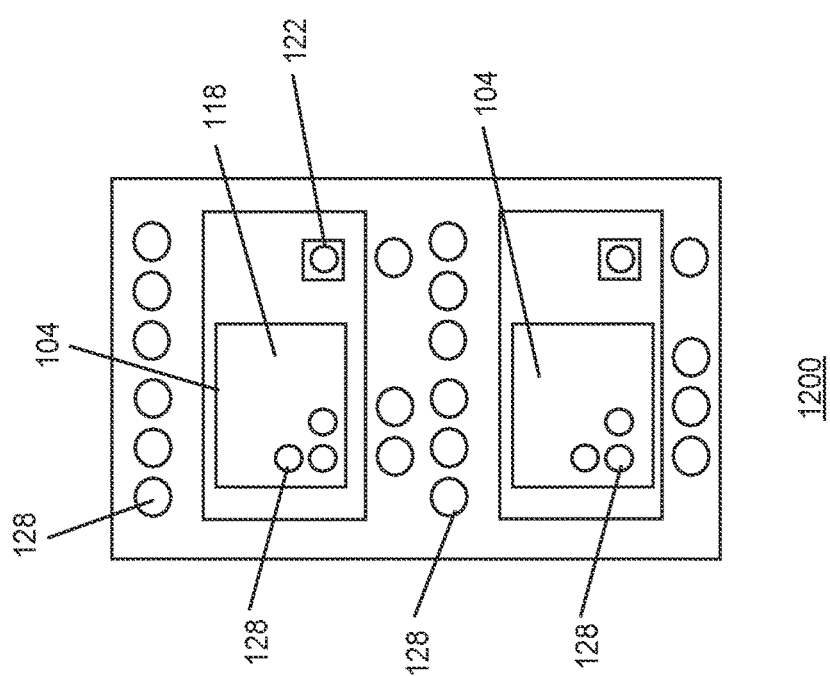
*FIGURE 7*

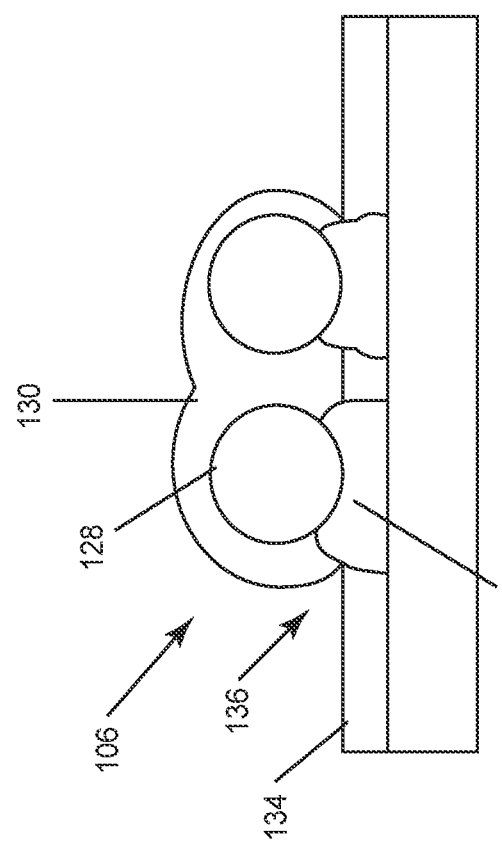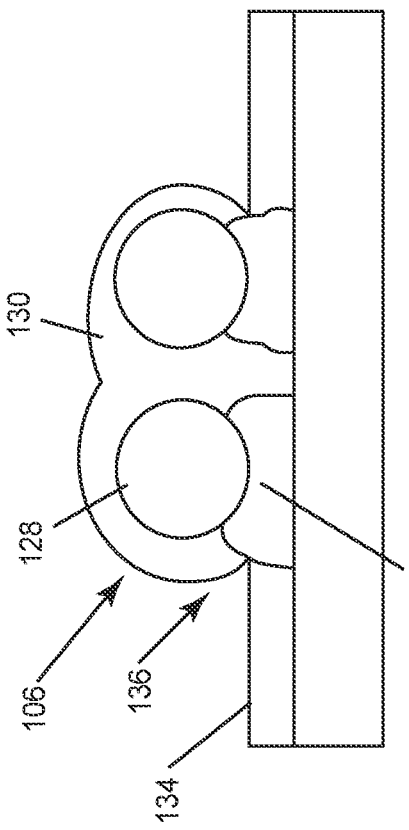

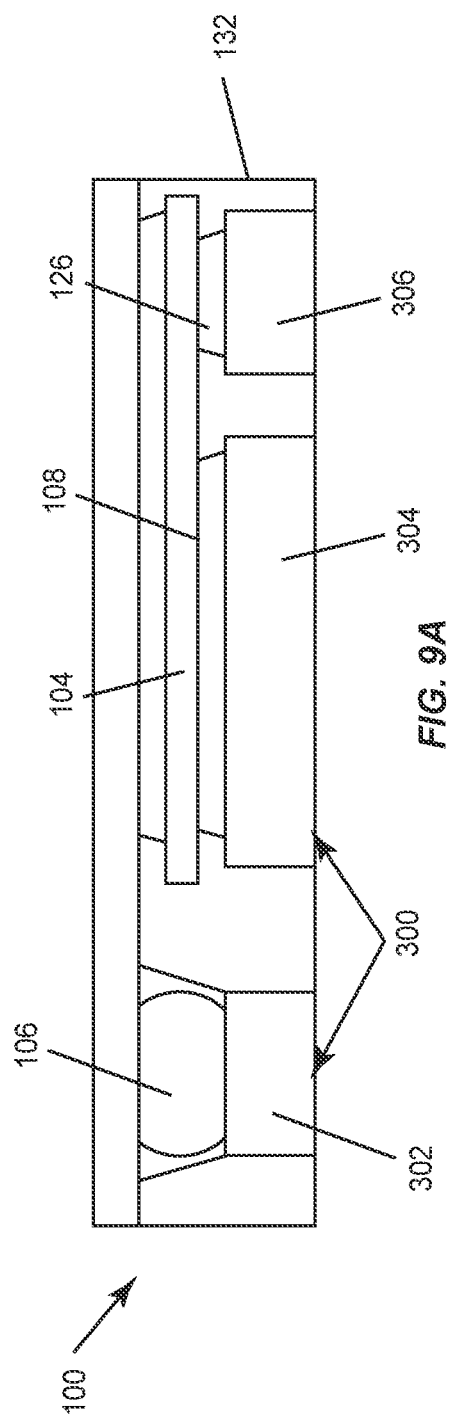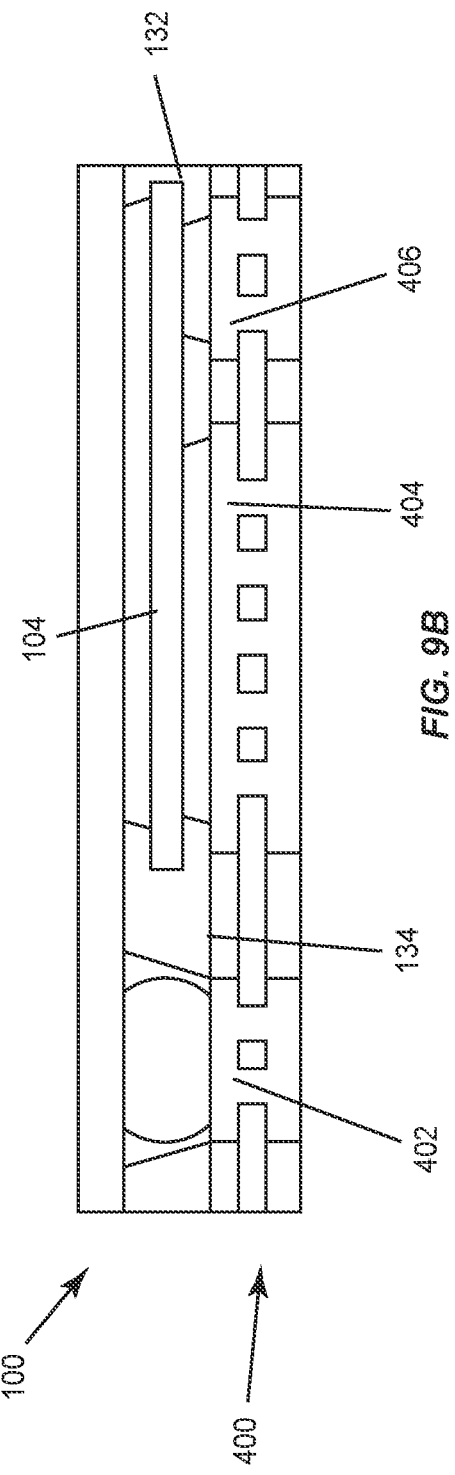

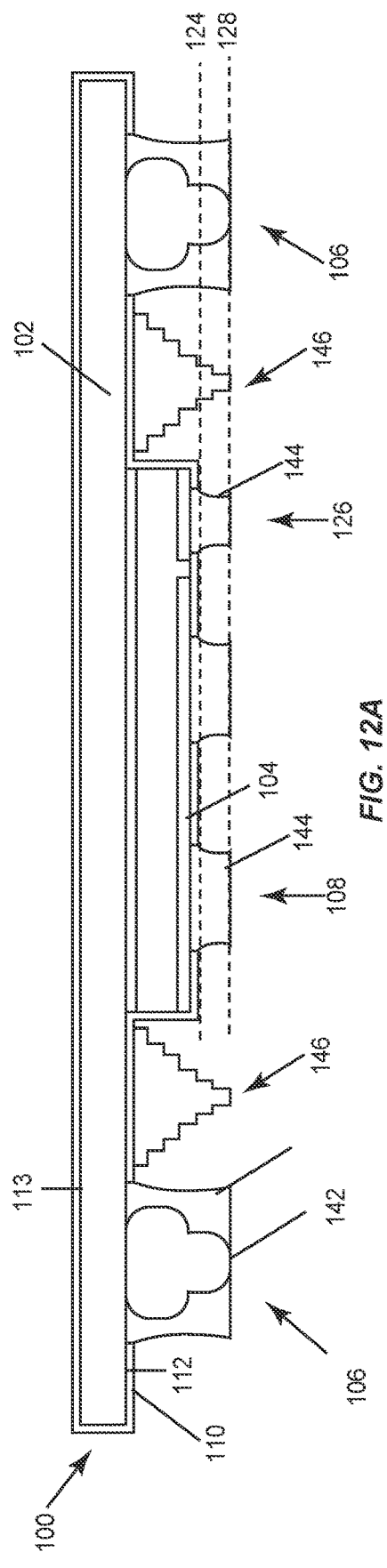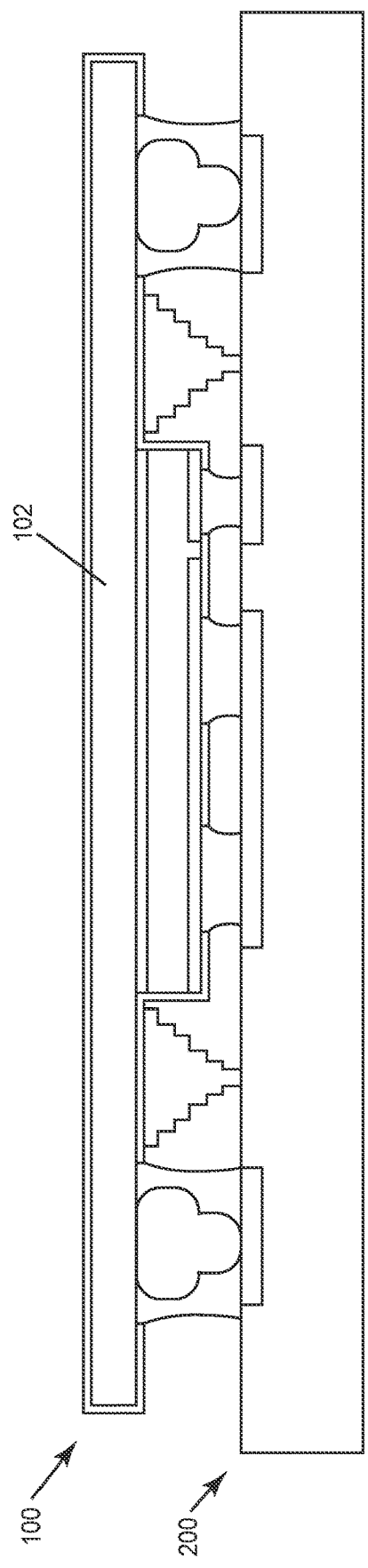
FIG. 12A
FIG. 12B

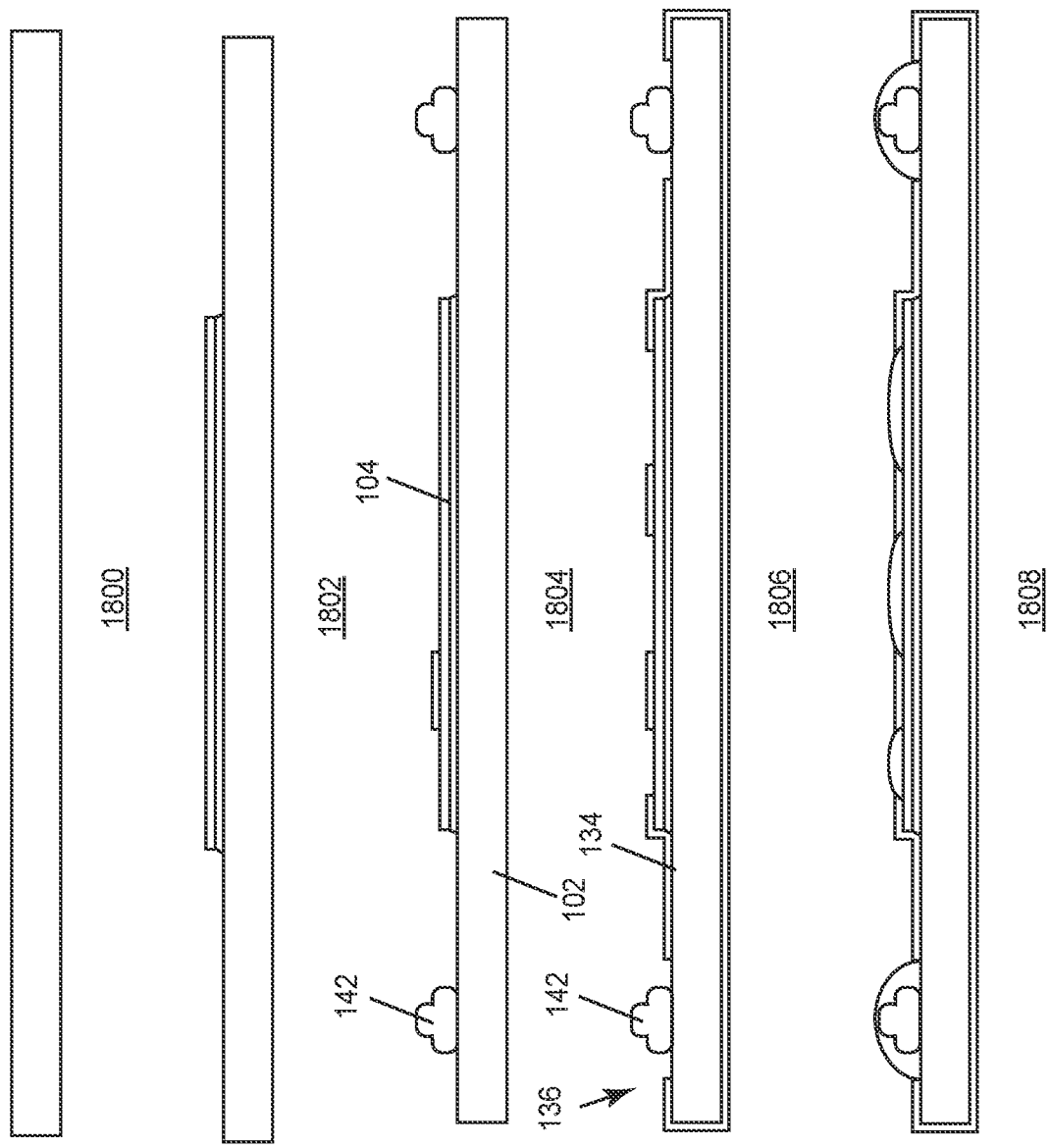

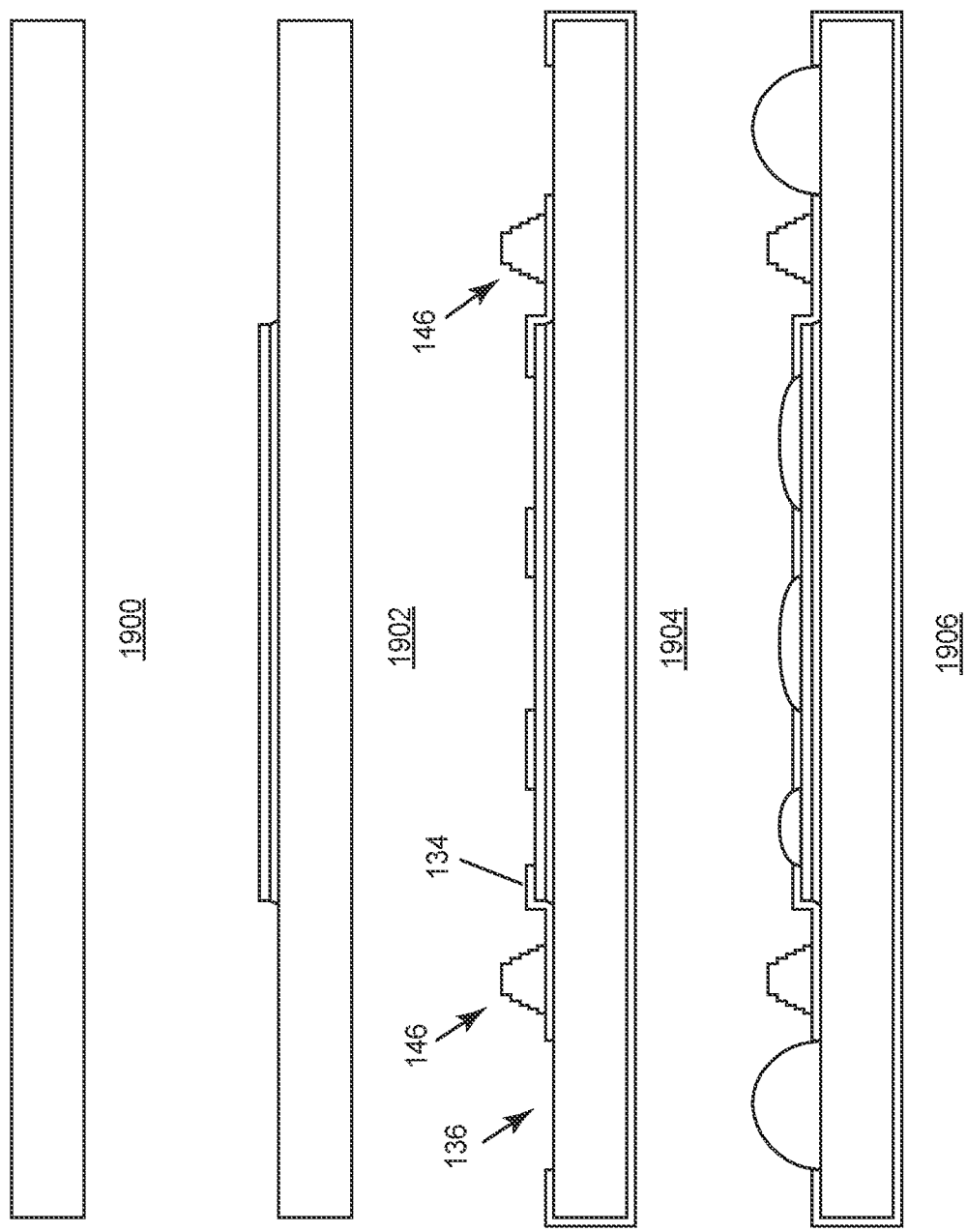

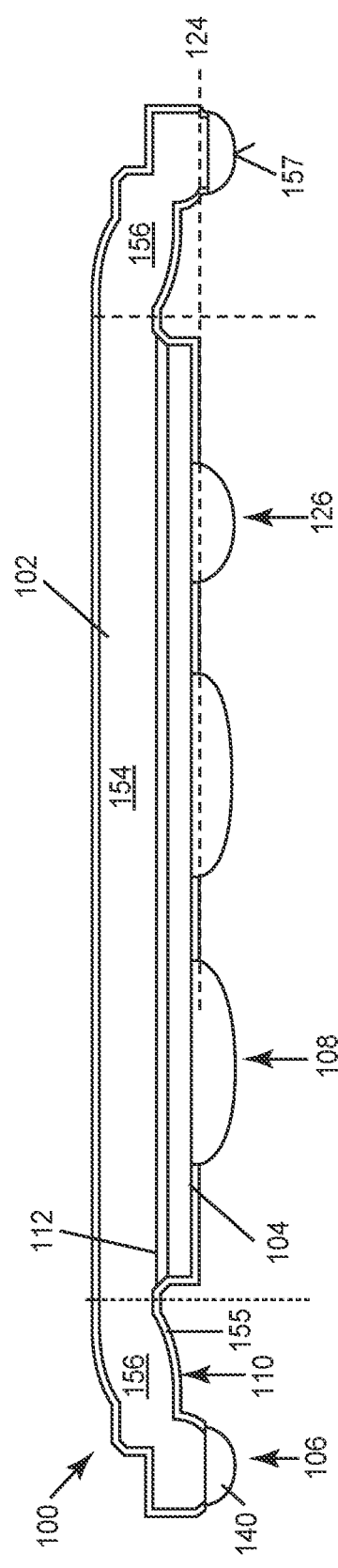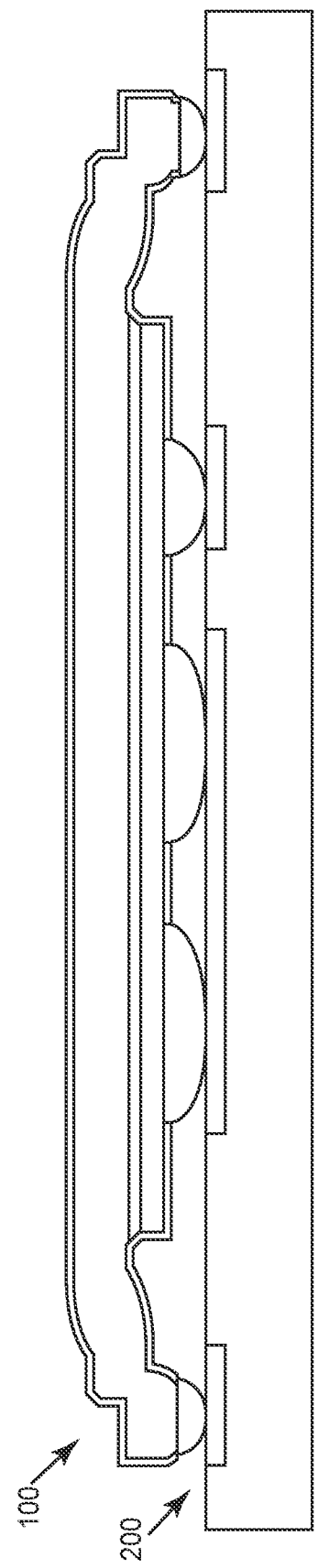
FIG. 18A
FIG. 18B

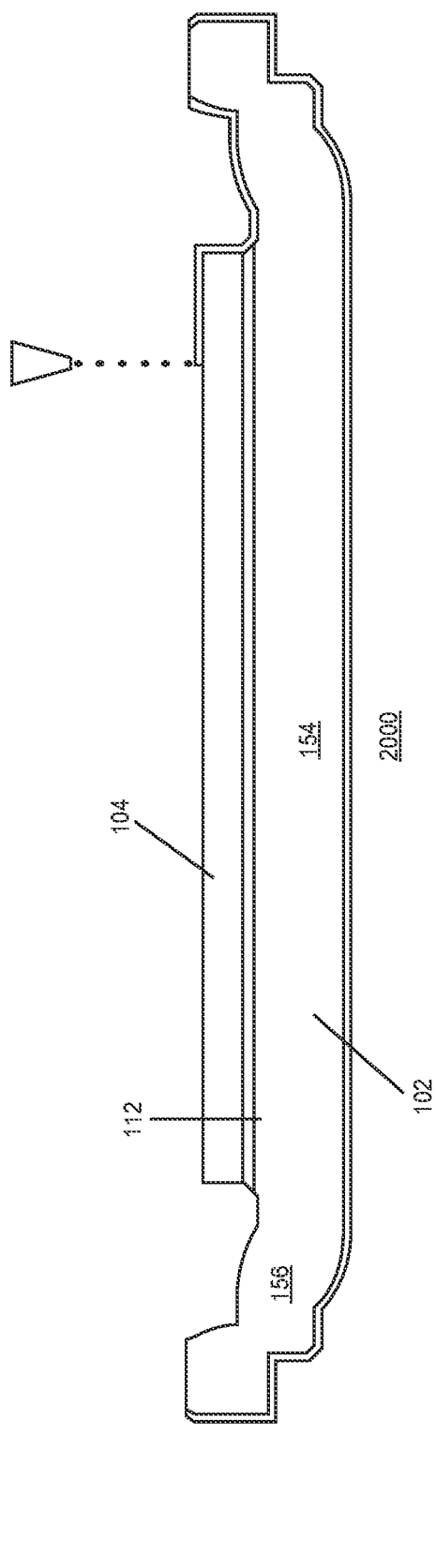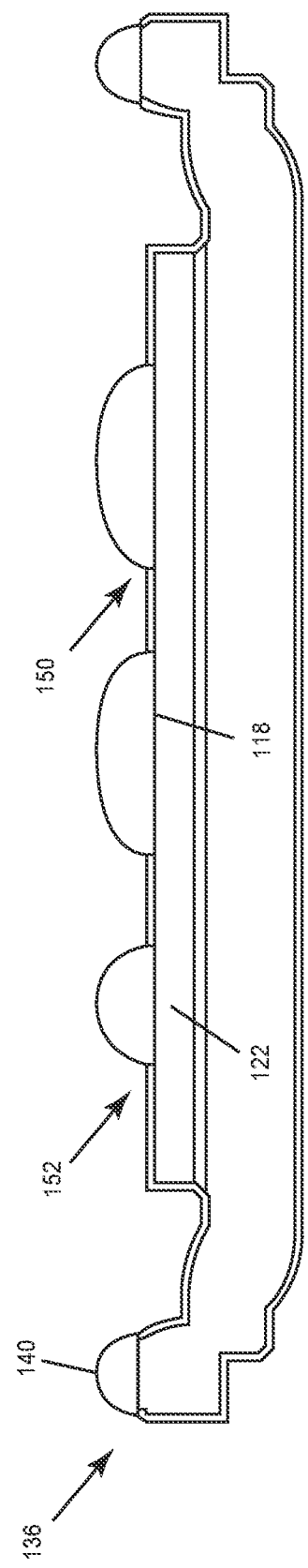

SEMICONDUCTOR ASSEMBLY WITH CONDUCTIVE FRAME FOR I/O STANDOFF AND THERMAL DISSIPATION

TECHNICAL FIELD

The instant application relates to semiconductor devices, and particularly relates to assemblies for interfacing semiconductor dies with circuit boards.

BACKGROUND

Printed circuit boards are commonly used to physically accommodate and electrically connect multiple electronic components, e.g., semiconductor dies, inductors, capacitors, etc., together. Typically, a mechanism is needed for connecting the I/O (input-output) terminals of each device to corresponding I/O terminals of the printed circuit board. Semiconductor packages represent one common mechanism for electrically connecting the I/O terminals of a semiconductor die to the interfacing I/O terminals of the printed circuit board. Semiconductor packages includes a number of electrically conductive leads that electrically connected to the terminals of the semiconductor die and designed to interface with the I/O terminals of the printed circuit board. Additionally, semiconductor packages include an electrically insulating material that protects the semiconductor die and provides electrical isolation between the various terminals. As die sizes decrease and power density increases, these semiconductor package designs can be ineffective or sub-optimal in certain applications.

Surface mount technology refers to a technique wherein the semiconductor die is placed directly on a circuit board with the I/O terminals of the semiconductor die facing and electrically connected to the I/O terminals of the circuit board. In comparison to a conventional discrete semiconductor package design, surface mount technology can allow for denser I/O electrical connections and lower electrical resistance. In surface mount technology, a conductive adhesive, e.g., solder, sinter, etc., is used to mate the I/O terminals of the semiconductor die to the I/O terminals of the circuit board. Designers impose standoff requirements to prevent electrical shorting of the conductive adhesive between different terminals. Lateral standoff requirements define a minimum lateral separation distance between immediately adjacent I/O connections to account for movement and imprecision in forming the conductive adhesive. Vertical standoff requirements define a minimum vertical separation between the semiconductor die and the circuit board to account for issues such as squeezing of the adhesive and outgassing, for example.

It is desirable to provide a low cost and reliable mechanism for mounting and connecting a semiconductor die to a PCB with the necessary I/O connections.

SUMMARY

A semiconductor device is disclosed. According to an embodiment, the semiconductor device includes a conductive frame comprising a die attach surface that is substantially planar, a semiconductor die comprising a first terminal disposed on a rear surface of the semiconductor die and a second terminal disposed on a main surface of the semiconductor die that is opposite the rear surface, a first conductive contact structure disposed on the die attach surface with a lateral separation between the first conductive contact structure and the semiconductor die, and a second conductive contact structure on the main surface of the semiconductor die. The semiconductor is mounted to the die attach surface such that the first terminal faces and is electrically connected to the conductive frame. The first conductive contact structure is configured as a point of electrical contact to the first terminal via the frame. The second conductive contact structure is configured as a point of electrical contact to the second terminal. The first conductive contact structure vertically extends past a plane of the main surface of the semiconductor die. The first conductive contact structure is electrically isolated from the main surface of the semiconductor die by an electrical isolation structure formed on the die attach surface. An upper surface of the electrical isolation structure is below the main surface of the semiconductor die.

Separately or in combination, the die attach surface has a greater area than an areal footprint of the semiconductor die, and the semiconductor die is affixed to the die attach surface such that the die attach surface laterally extends past the semiconductor die in every direction.

Separately or in combination, the semiconductor device further comprises a plurality of the first conductive contact structures each being formed on the die attach surface and each being configured as a point of electrical contact to the first terminal.

Separately or in combination, the frame has a substantially uniform thickness throughout an entire area of the frame.

Separately or in combination, the frame has a central die attach portion and an end connector portion, wherein the central die attach portion comprises the die attach surface, and wherein the end connector portion bends away from central die attach portion.

Separately or in combination, a thickness of the electrical isolation structure is less than a thickness of the semiconductor die.

Separately or in combination, the electrical isolation structure comprises a solder resistant layer that is formed directly on the die attach surface in a lateral region between the first contact structure and the semiconductor die.

Separately or in combination, the solder resistant layer conformally encapsulates the semiconductor die.

Separately or in combination, the solder resistant layer completely covers an upper surface of the frame that comprises the die attach surface.

Separately or in combination, the first conductive contact structure comprises a metal containing bump, stud or ball structure that is formed directly on the die attach surface, and a fusible conductive adhesive material that is formed around the metal containing bump, stud or ball structure.

Separately or in combination, the semiconductor device further comprises a turret of electrically insulating material disposed on the die attach surface between the first conductive contact structure and the semiconductor die, and the turret vertically extends past the plane of the main surface of the semiconductor die.

Separately or in combination, the first and second contact structures reach a second plane that is offset from the plane of the main surface of the semiconductor die, and an upper end of the turret is at least substantially coplanar with the second plane.

According to another embodiment, the semiconductor device includes a metal frame comprising a central die attach portion and an end connector portion, the central die attach portion comprising a substantially planar die attach surface, the end connector portion bending away from the central die attach surface, and a semiconductor die comprising a first terminal disposed on a rear surface of the semiconductor die and a second terminal disposed on a main surface of the semiconductor die that is opposite the rear surface, a first conductive contact surface in the end connector portion of the frame, and the semiconductor die is affixed to the die attach surface with the rear surface of the semiconductor die facing the metal frame and the first terminal electrically connected to the metal frame, the first conductive contact surface is conductively connected to the first terminal via the metal frame, and the first conductive contact surface is disposed on or above a plane of the main surface of the semiconductor die.

Separately or in combination, the first conductive contact surface is provided by a fusible conductive adhesive material that is formed on an upper surface of the end connector portion, and the upper surface of the end connector portion is substantially coplanar with the plane of the main surface of the semiconductor die.

Separately or in combination, the semiconductor device further comprises a second conductive contact structure formed on the main surface of the semiconductor die and comprising a fusible conductive adhesive material, the second conductive contact structure is directly electrically connected to the second terminal, the semiconductor device further comprises an electrically insulating coating layer formed on the metal frame and semiconductor die, and the fusible conductive adhesive material of the first and second conductive contact structures protrudes out of the electrically insulating coating layer.

According to an embodiment, the semiconductor device includes a conductive frame that has a substantially uniform thickness throughout the frame and comprises a die attach surface that is substantially planar, a semiconductor die comprising a first terminal disposed on a rear surface of the semiconductor die and a second terminal disposed on a main surface of the semiconductor die that is opposite the rear surface, a first conductive contact structure disposed on the die attach surface with a lateral separation between the first conductive contact structure and the semiconductor die, a second conductive contact structure on the second terminal of the semiconductor die, and an electrically insulating encapsulant body disposed on the die attach surface, the encapsulant body encapsulating the semiconductor die and surrounding the first and second conductive contact structures. The first and second conductive contact structures each comprise a fusible conductive adhesive material. The encapsulant body includes a substantially planar upper surface that is opposite from the die attach surface. The first and second conductive contact structures are each exposed from the upper surface of the encapsulant body, and the exposed portions of the first and second conductive contact structures are spaced apart from an edge side of the encapsulant body by a region of the planar upper surface.

Separately or in combination, the die attach surface has a greater area than an areal footprint of the semiconductor die, and the semiconductor die is affixed to the die attach surface such that the die attach surface laterally extends past the semiconductor die in every direction.

Separately or in combination, the semiconductor device further comprises a plurality of the first conductive contact structures each being formed on the die attach surface and surrounding one or more sides of the semiconductor die, and each of the first conductive contact structures form discrete points of electrical contact to the first terminal.

Separately or in combination, the semiconductor device further comprises an electrically conductive lead frame structure that comprises first and second terminal pads that are spaced apart from one another, the first terminal pad is adhered to and electrically connected with the first conductive contact structure and the second terminal pad is adhered to and electrically connected with the second conductive contact structure.

Separately or in combination, the semiconductor device further comprises a circuit board that comprises an electrically insulating substrate and first and second terminal pads that are electrically isolated from one another by the substrate, and the first terminal pad is adhered to and electrically connected with the first conductive contact structure the second terminal pad is adhered to and electrically connected with the second conductive contact structure.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other Like reference numerals designate corresponding similar parts. The features of the various illustrated embodiments can be combined unless they exclude each other. Embodiments are depicted in the drawings and are detailed in the description which follows.

FIG. 3, which includes FIG. 3A depicts the frame-mounted semiconductor die assembly as a standalone component and FIG. 3B depicts the frame-mounted semiconductor die assembly mated with a circuit board.

FIG. 4, which includes FIG. 4A illustrates a plan view of an interfacing side of the assembly and FIG. 4B illustrates a plan view of an outer side of the assembly.

FIG. 7 depicts a planar view of soldering steps performed in a method of producing a frame-mounted semiconductor die assembly, according to an embodiment.

FIG. 8, which includes FIGS. 8A and 8B, depicts techniques for forming contact structures for a frame-mounted semiconductor die assembly, according to an embodiment FIG. 9, which includes FIGS. 9A and 9B, depicts a frame-mounted semiconductor die assembly mated with various components, according to embodiments.

FIG. 9A depicts the frame-mounted semiconductor die assembly mated with a lead frame structure. FIG. 9B depicts the frame-mounted semiconductor die assembly mated with a printed circuit board.

FIG. 12, which includes FIGS. 12A and 12B, depicts a side view of a frame-mounted semiconductor die assembly. according to an embodiment. FIG. 12A depicts the frame-mounted semiconductor die assembly as a standalone component and FIG. 12B depicts the frame-mounted semiconductor die assembly mated with a circuit board.

FIG. 16 depicts selected method steps in a method of producing a frame-mounted semiconductor die assembly, according to an embodiment.

FIG. 17 depicts selected method steps in a method of producing a frame-mounted semiconductor die assembly, according to an embodiment.

FIG. 18, which includes FIGS. 18A and 18B, depicts a side view of a frame-mounted semiconductor die assembly, according to an embodiment. FIG. 18A depicts the frame-mounted semiconductor die assembly as a standalone component and FIG. 18B depicts the frame-mounted semiconductor die assembly mated with a circuit board.

FIG. 20, which includes FIG. 20A and FIG. 20B, depicts selected method steps in a method of producing a frame-mounted semiconductor die assembly, according to an embodiment.

DETAILED DESCRIPTION

Figure 1:
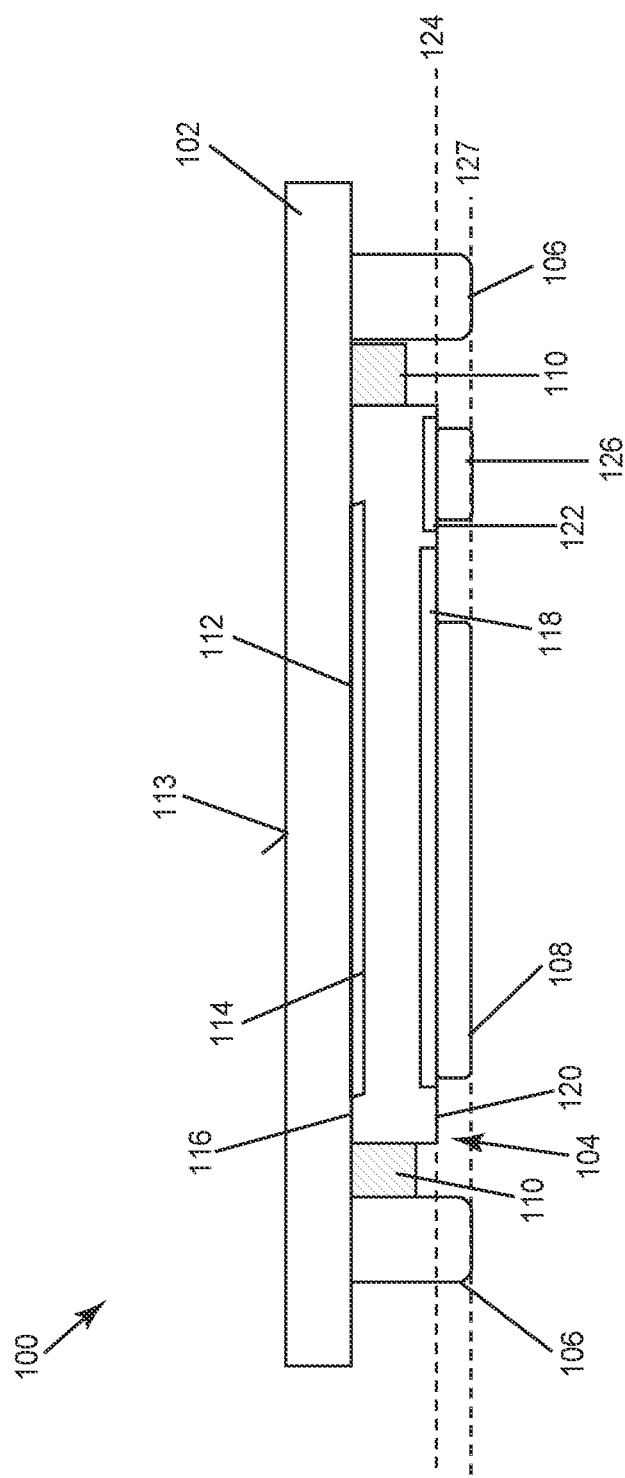
FIGS. 1 and 2 depict a schematic representation of a frame-mounted semiconductor die assembly, according to an embodiment.

Embodiments of a frame-mounted semiconductor die assembly are described herein. In embodiments, the frame-mounted semiconductor die assembly includes a conductive frame and a power semiconductor die. The conductive frame may be a substantially uniform thickness piece of sheet metal with a planar die attach surface. The conductive frame is mounted and electrically connected to a first terminal of the semiconductor die. The frame may be larger than the semiconductor die such that an outer area of the die attach surface completely extends past the semiconductor die in every direction. Conductive contact structures are formed in this outer area of the die attach surface, and on a second terminal of the semiconductor die. These conductive contact structures provide interfacing points of electrical contact to the I/O terminals of the semiconductor die. The frame-mounted semiconductor die assembly additionally includes an electrical isolation structure that electrically isolates these interfacing points of electrical contact from one another. In various embodiments, the frame-mounted semiconductor die assembly may include structures designed to maintain a fixed vertical standoff between the assembly and an external circuit board. An increased vertical standoff allows for improved outgassing of volatiles contained in the flux during reflow of the solder material disposed between the semiconductor die and the frame. Additionally, an increased vertical standoff will also improve the reliability of the solder joint interconnects during temperature cycling by increasing the separation between the die and the PCB.

The embodiments described herein advantageously provide a low cost solution for mounting a semiconductor die to a PCB with large lateral standoff distance between the I/O terminals, fixed vertical separation distance between the die and the PCB, and low thermal and electrical resistance in the terminal connections. This is attributable at least in part to the fact that the frame provides a large area to spread out the I/O contact points, thereby enabling lower connection density. This enables compatibility with the line and space capabilities of the end customer's PCB. The frame also provides a low resistance connection path for these I/O connections. Moreover, the frame can be provided simply and inexpensively from a planar sheet metal. An effective electrical isolation structure may be formed simply and inexpensively by spraying or coating the assembly with a solder resist material, for example. Additionally, the frame advantageously provides a large conductive surface that is compatible with a top-side cooling heat sink structure. Additionally, the frame concept allows for freedom to design I/O arrangement and is easily scalable to different sizes by appropriately cutting a metal sheet into the desired size.

The embodiments described herein are advantageously well suited for batch processing wherein multiple devices are formed simultaneously. This is at least partly attributable to the fact that the conductive frame can be provided by a large metal sheet, such as a flat undisturbed metal panel or a structured lead frame. These large metal sheets can accommodate multiple semiconductor dies. Moreover, the processing techniques described herein, e.g., solder ball formation, solder resist formation, etc., can be performed in batch format. Moreover, different devices with different die sizes can be provided on a single metal sheet, and the size of the conductive frame for each device can easily be customized through the cutting step. Accordingly, the technique allows for efficient batch processing of different device types and using common processing steps. Finally, via singulation processes, these formed multiple devices can be separated as multiple individual devices.

Referring to FIG. 1, a frame-mounted semiconductor die assembly 100 is depicted, according to an embodiment. The frame-mounted semiconductor die assembly 100 includes a frame 102, a semiconductor die 104, one or more first contact structures 106, one or more second contact structures 108, and an electrical isolation structure 110.

The frame 102 is an electrically and thermally conductive structure that is configured to carry operational currents away from the semiconductor die 104, and to provide thermal dissipation of heat generated by the semiconductor die 104 during operation. Exemplary materials of the frame 102 include conductive metals, such as copper, aluminum, nickel, iron, zinc, etc. and alloys thereof.

Figure 2:
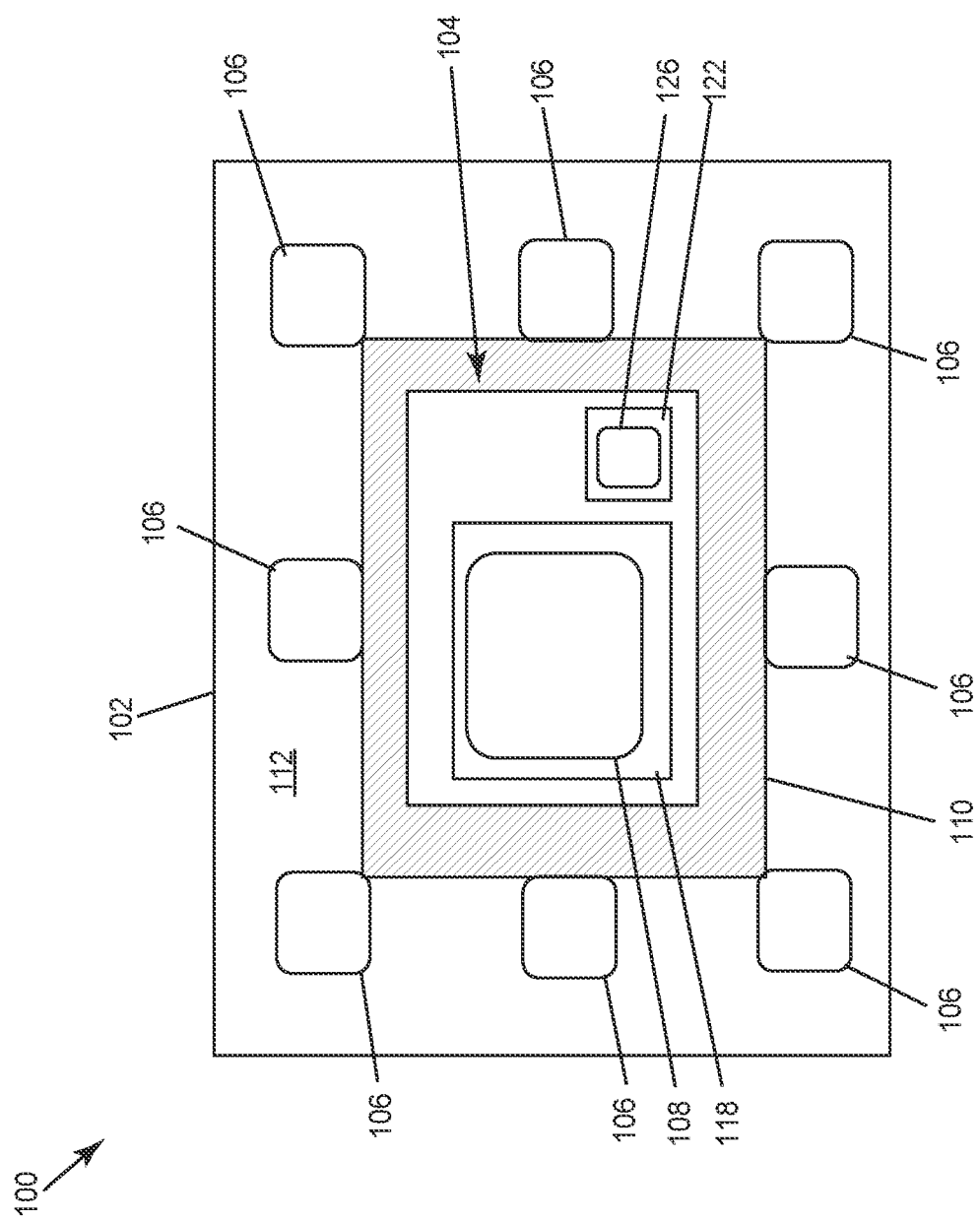

The frame 102 includes a die attach surface 112 that is configured to be mated with a semiconductor die 104, and to accommodate a number of contact structures around the semiconductor die 104. According to an embodiment, the die attach surface 112 is a substantially planar surface. More particularly, the die attach surface 112 is a substantially planar surface with a greater area than an areal footprint of the semiconductor die 104. Hence, when the semiconductor die 104 is mounted to the die attach surface 112 in the depicted manner, the die attach surface 112 provides a lateral platform that is coplanar with the interfacing surface of the semiconductor die 104 and completely surrounds the semiconductor die 104 in every direction, e.g., as shown in FIG. 2. According to an embodiment, the frame 102 is a substantially uniform thickness structure. This means that a distance between opposite facing upper and lower surfaces of the frame 102 remains substantially constant across an entire area of the frame 102. According to an embodiment, the frame 102 is a substantially flat structure. This means that the die attach surface 112 and a rear surface 113 that is opposite from the die attach surface 112 are substantially planar surfaces that are parallel to one another across an entire area of the frame 102. In another embodiment, the frame 102 may include curves or bends.

The semiconductor die 104 includes a first terminal 114 disposed on a rear surface 116 of the semiconductor die 104 and a second terminal 118 disposed on a main surface 120 of the semiconductor die 104 that is opposite the rear surface 116. Each of the first and second terminals 114, 118 may be implemented by electrically conductive bond pads that are respectively coplanar or substantially close to coplanar with the main and rear surfaces 120, 116, respectively.

The semiconductor die 104 is mounted to the die attach surface 112 such that the first terminal 118 faces and is electrically connected to the conductive frame 102. This electrical connection may be effectuated by a conductive die attach material, such as solder, sinter, conductive glue, etc., that is provided between the second terminal 118 and the die attach surface 112.

Generally speaking, the semiconductor die 104 can have a wide variety of device configurations. These configurations include discrete device configurations such as a MOSFET (Metal Oxide Semiconductor Field Effect Transistor), an IGBT (Insulated Gate Bipolar Transistor), a JFET (Junction Field Effect Transistor), a diode, etc. These configurations additionally include integrated circuit configurations such as amplifiers, controllers, processors, etc. Moreover, the semiconductor die 104 may include any of a wide variety of semiconductor materials. These semiconductor materials include type IV semiconductors, e.g., silicon, silicon germanium, silicon carbide, etc., and type III-V semiconductors, e.g., gallium nitride, gallium arsenide, etc. The semiconductor die 104 may be configured as a vertical device that is configured to control a current flowing between opposite facing upper and lower surfaces, or a lateral device that is configured to control a current flowing parallel to a main upper surface.

According to an embodiment, the semiconductor die 104 is configured as a discrete power device that is configured to block a substantially large voltage (e.g., a voltage in the range of 100V, 500V, 1000V or more) and/or control a substantially large current (e.g., a current in the range of 1 A, 2 A, 5 A or more) as between the first and second terminals 114, 118. For example, the semiconductor die 104 may be configured as a power MOSFET device, wherein the first and second terminals 114, 118 respectively correspond to the drain and source terminals of the device, or vice-versa. In another example, the semiconductor die 104 is configured as a power diode, wherein the first and second terminals 114, 118 respectively correspond to the cathode and anode terminals of the device, or vice-versa. As shown, the semiconductor die 104 may optionally include a third terminal 122 on the main surface 120. The third terminal 122 may correspond to a control terminal of the device, e.g., a gate terminal in the case of a MOSFET.

The first contact structure 106 is an electrically conductive structure that is separate from the frame 102. The first contact structure 106 configured as a point of electrical contact to the first terminal 114 via the frame. That is, the frame provides an electrical connection between the first terminal 114 and the first contact structure 106. According to an embodiment, the first contact structure 106 vertically extends to a plane 124 of the main surface 120 of the semiconductor die 104. That is, the first contact structure 106 extends from the frame 102 to reach or extend past the plane 124 of the main surface 120 of the semiconductor die 104. The plane 124 of the main surface 120 of the semiconductor die 104 is an imaginary plane that is coplanar with the main surface 120 of the semiconductor die 104. By vertically extending to or beyond the plane 124 of the main surface 120, the first contact structure 106 is configured to provide a point of electrical contact with the terminals of a circuit board when the assembly is mated with the circuit board.

According to an embodiment, the first contact structure 106 optionally includes a fusible conductive adhesive material. A fusible conductive adhesive material is a conductive material which can be transformed from a malleable state to a hardened state by a stimulus such as cooling, drying, mechanical pressure, etc., with the result being a stable electrical and mechanical bond between joined items. Examples of fusible adhesives include solder materials, sinter materials, conductive pastes, etc.

According to an embodiment, the first contact structure 106 optionally includes a conductive ball structure that is formed directly on the die attach surface 112, and an amorphous region of fusible conductive adhesive material formed around the conductive ball structure 120. The conductive ball structure may include a conductive metal, e.g., copper, gold, silver, etc. This conductive metal may be mixed with a solder material, e.g., tin based solder, so as to provide a solderable structure. Alternatively, this conductive metal may be a region of substantially pure metal with a higher melting point than region of fusible conductive adhesive material so as to maintain rigidity during reflow of the fusible conductive adhesive material. In another embodiment, the first contact structure 106 includes a metal stud or pillar structure that is covered by the fusible conductive adhesive material.

The second contact structure 108 is an electrically conductive structure that is disposed on the main surface 120 of the semiconductor die 104. Specifically, in some embodiments, the second contact structure 108 is formed directly on the second terminal 118. Similarly, in some embodiments, the device may include a third contact structure 126 that is formed directly on the control terminal 122. Generally speaking, the second and third contact structures 108, 126 may have a similar or identical material composition as the first contact structure 106 as discussed above. According to an embodiment, the second and third contact structures 108, 126 include a fusible conductive adhesive material, e.g., solder material, sinter material, conductive pastes, etc.

The second contact structure 108 is configured as a direct point of electrical contact to the second terminal 118. This is, the second contact structure 108 directly contacts and forms a low-ohmic connection with the second terminal 118. Likewise, the third contact structure 126 is configured as a (direct) point of electrical contact to the control terminal 122. According to an embodiment, the second and third contact structures 108, 126 each vertically extend to a second plane 127 that is substantially coplanar with an end of the first contact structure 126. In this way, the frame-mounted semiconductor die 104 assembly 100 can be mated with a planar circuit board with each of the first, second and third contact structures 106, 108, 126 providing apex points that contact and interface with the circuit board. In other embodiments, the second plane 127 that is substantially coplanar with an end of the first contact structure 126 may be offset from the second and third contact structures 106, 108. This allows for the outer contacts of the device to absorb forces during component placement and mitigates the possibility of damage to the semiconductor die 104. In that case, electrical connection to the second and third contact structures 106, 108 may be effectuated using additional fusible adhesive and/or by appropriately reflowing the material of the first contact structure 126.

The electrical isolation structure 110 is configured to electrically isolate the first contact structure 106 from the other terminals of the assembly, i.e., the second terminal 118 and the control terminal 126 in this example. The electrical isolation structure 110 is formed at least in the lateral space between the first contact structure 106 and the semiconductor die 104 and includes an electrically insulating material. As will be evidenced by the embodiments to be described below, the electrical isolation structure 110 can be implemented with a variety of different insulator materials and structures. Examples of insulator materials include epoxies, solder resist materials (e.g., liquid photoimageable solder mask (LPSM or LPI) inks and dry-film photo-imageable solder mask (DFSM))), polymers (e.g., parylene), mold compounds (e.g., thermosetting resins or plastics), etc. In the case that the electrical isolation structure 100 includes a solder resist material, the solder resist material may be an organic polymer such as an epoxy or imide material. Moreover, the solder material may contain fillers that reduce the expansion coefficient of the material and enable a closer match to that of the semiconductor die 104 and/or frame 102. Additionally or alternatively, the solder resistant material may contain a pigment to add color to the material and improve the contrast of the material with respect to the conductive contacts, which in turn will help ensure the material can be easily identified using vision systems during manufacturing. The solder resist material can be a thin layer of conformally deposited material, e.g., on the order of 1 μm-100 μm thick. In the case that the electrical isolation structure 110 includes a mold compound material, the electrical isolation structure 110 may include one or more layers of mold compound material on top of a solder resist layer.

According to an embodiment, an upper surface of the electrical isolation structure 110 is below the second plane 127. Moreover, the upper surface of the electrical isolation structure 110 may be below the main surface 120 of the semiconductor die 104, e.g., as shown in FIG. 1.

Referring to FIG. 2, the frame-mounted semiconductor die assembly 100 described with reference to FIG. 1 is depicted from a plan-view perspective. As can be seen, the die attach surface 112 has a greater area than the than an areal footprint of the semiconductor die 104 such that portions of the die attach surface 112 laterally extend past the semiconductor die 104 in every direction. As can be seen, the assembly 100 includes multiple discrete points of electrical contact to the first terminal 114, with each of these points of electrical contact being electrically isolated from the semiconductor die 104 by the electrical isolation structure 110. In the depicted embodiment, the first contact structures 106 are disposed in a pattern that surrounds the semiconductor die 104. Pairs of the first contact structures 106 are laterally disposed on opposite sides of the semiconductor die 104. In another embodiment (not shown), the first contact structures 106 may be provided on one or more sides of the semiconductor die 104, but less than all sides, thereby providing a space-efficient layout.

Figure 3A:
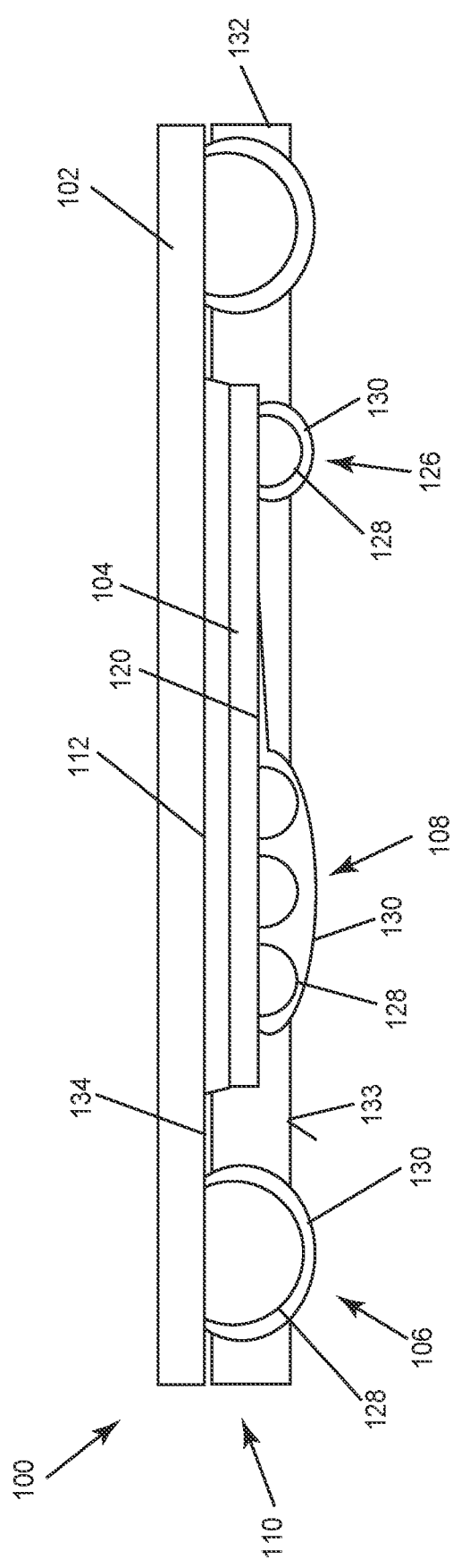
FIGS. 3A and 3B, depicts a side view of a frame-mounted semiconductor die assembly, according to an embodiment.

Referring to FIG. 3, an implementation of the frame-mounted semiconductor die assembly 100 described with reference to FIGS. 1-2 is depicted, according to an embodiment. In this embodiment, the frame 102 is configured as a substantially flat and uniform thickness piece of metal. The first contact structure 106 is configured as an electrical interconnect structure. For example, the first contact structure 106 may include interconnect structures such as solder balls, stud bumps, etc. According to an embodiment, the first contact structure 104 includes a solder ball 128, which may be a core of conductive metal, such as gold, copper, tin, etc., and alloys thereof, and a region of solder material 130 (e.g., tin or lead based solder) covering the metal core. The second and third contact structures 108, 126 include similarly configured solder balls 128 and regions of solder material 130. In another embodiment, the second and third contact structures 108, 126 are exclusively formed from solder material.

Figure 3B:
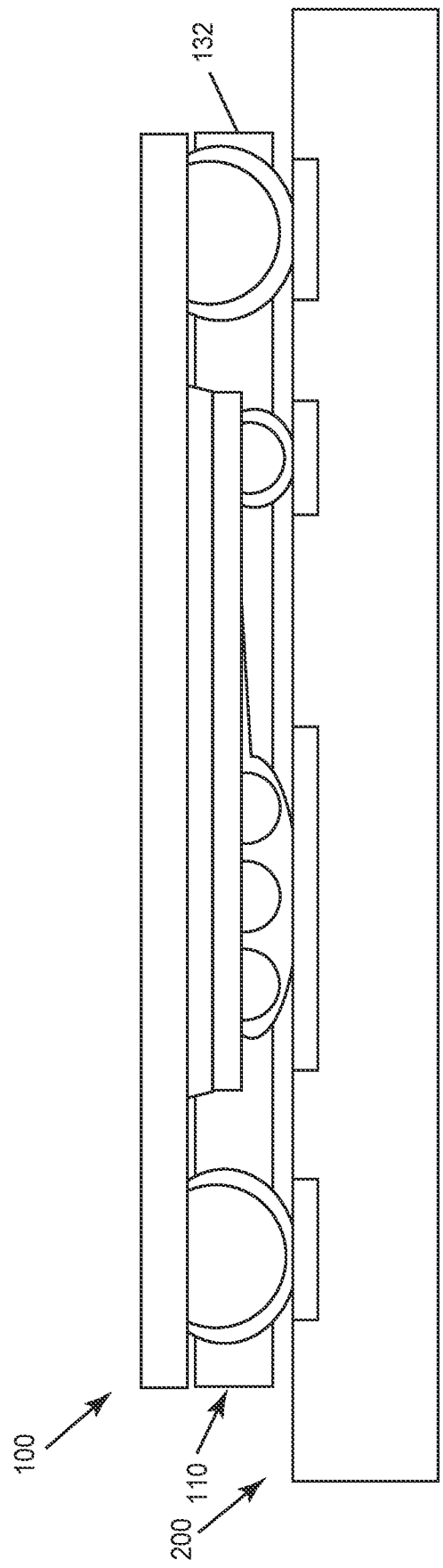

In the embodiment of FIG. 3, the electrical isolation structure 110 includes a first layer 134 of solder resist material formed on the die attach surface 112 adjacent to the semiconductor die 104. The first layer 134 of solder resist material may include any of a variety of solder resist materials, such as epoxy liquid, liquid photoimageable solder mask (LPSM or LPI) inks and dry-film photo-imageable solder mask (DFSM) materials. Optionally, the electrical isolation structure 110 may additionally include electrically insulating mold material. Specifically, as shown in FIG. 3, the frame-mounted semiconductor die assembly 100 includes an encapsulant body 132 of electrically insulating mold material. The encapsulant body 132 provides additional electrical isolation between the first conductive contact structure 106 and the semiconductor die 104 and may provide a protective structure. Generally speaking, the mold material of the encapsulant body 132 can include any of a variety of mold compounds such as epoxy resins, thermosetting plastics, etc. The encapsulant body 132 encapsulates the semiconductor die 104. That is, the encapsulant body 132 forms a complete protective structure that covers all regions of the semiconductor die except the areas containing the second and third contact structures 108, 126. Additionally, the encapsulant body 132 partially surrounds the first, second and third contact structures 106, 108 and 126. The encapsulant body 132 includes a substantially planar upper surface 133 that is opposite from the die attach surface 112. This upper surface 133 may be substantially parallel to the die attach surface 112 and/or to the main surface 120 of the semiconductor die 104. The first, second and third contact structures 106, 108 and 126 protrude from the upper surface 133 of the encapsulant body 132 such that the solder material of these structures is exposed from the planar upper surface 133. Accordingly, the first, second and third contact structures 106, 108 and 126 are configured as points of electrical contact, respectively, to the first terminal 114, the second terminal 118, and the control terminal for a face-down mating with a circuit board 200, as shown in FIG. 3B.

Figure 4A:
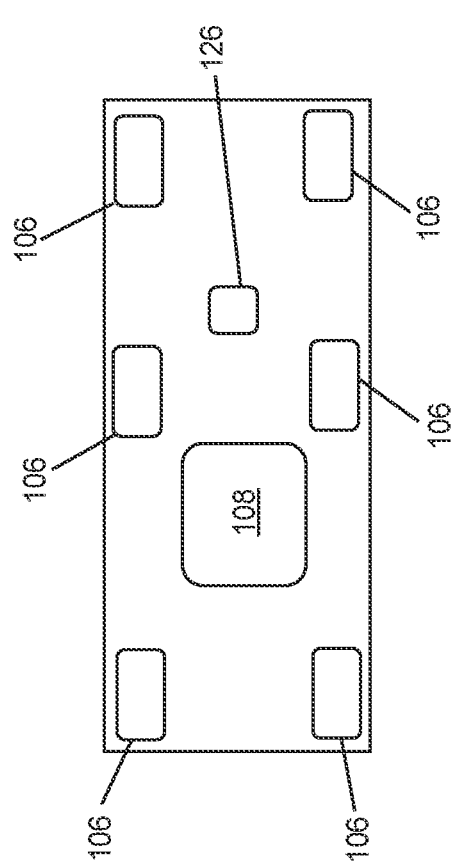
FIGS. 4A and 4B, depicts views of the frame-mounted semiconductor die assembly, according to an embodiment.
Figure 4B:
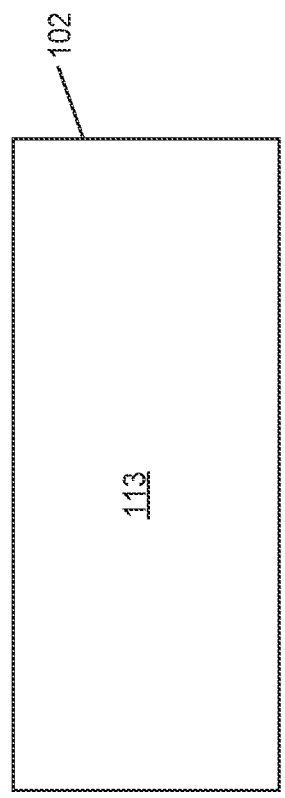

Referring to FIG. 4, top and bottom sides of the frame-mounted semiconductor die assembly 100 of FIG. 3 are depicted. As can be seen in FIG. 4A, the frame-mounted semiconductor die assembly 100 includes multiple ones of the first contact structures 106 protruding from the encapsulant body 132. Each of these first contact structures 106 provide a separate parallel channel for connection to the first terminal 114. As a result, the electrical and thermal resistance of the connection to the first terminal 114 is reduced. Additionally, a large connection area to the second terminal 118 of the semiconductor die 104 can be provided through the merging of multiple solder balls by solder material.

Figure 5:
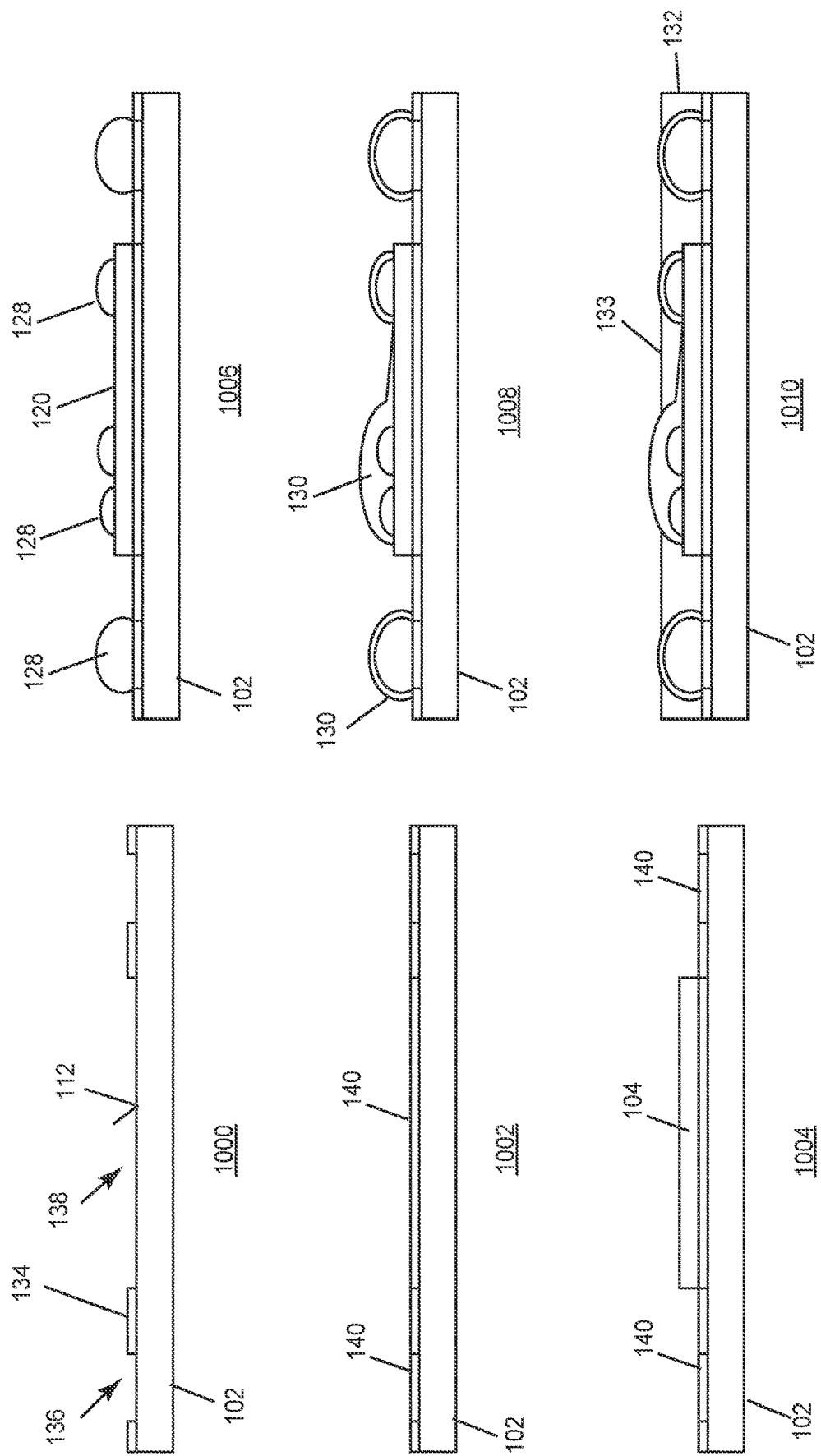
FIG. 5 depicts selected method steps in a method of producing a frame-mounted semiconductor die assembly, according to an embodiment.

Referring to FIG. 5, a method of producing the frame-mounted semiconductor die assembly 100 described in FIGS. 3 and 4 is depicted, according to an embodiment.

As shown in process step 1000, the conductive frame 102 is provided. Generally speaking, the conductive frame 102 can be provided by an electrically conductive and substantially uniform thickness structure. In one example, the conductive frame 102 is provided from a substantially flat and undisturbed panel of metal such as copper, aluminum, alloys thereof, etc. In another example, the conductive frame 102 is provided from a lead frame structure of metal e.g., copper, aluminum, alloys thereof, etc., that is pre-patterned with openings and tie bar features that define multiple sites for attachment. In either case, the metal structure can be singulated into individual frames 102 before, during, or after any of the processing steps described herein. After providing the frame 102, the first layer 134 of solder resist material is formed on the die attach surface 112. The first layer 134 of solder resist material can be formed by silkscreening or spraying technique, for example. The first layer 134 of solder resist material is structured to include first and second openings 136, 138 that expose the die attach surface 112.

As shown in process step 1002, a conductive adhesive material 140 is formed in the first and second openings 136, 138. Generally speaking, the conductive adhesive material 140 can include any of a wide variety of die attach adhesives, e.g. solder, sinter, conductive glue, conductive tape, etc.

As shown in process step 1004, the semiconductor die 104 is affixed to the frame 102 by the conductive adhesive material 140 formed in the second opening 138. This attachment forms a mechanical connection between the semiconductor die 104 and frame 102 and forms the electrical connection between the first terminal 114 and the frame 102. The attachment process may include the application of heat (e.g., in the case of solder or sinter reflow) or mechanical pressure (e.g., in the case of glue or tape).

As shown in process step 1006, solder balls 128 are formed on the conductive adhesive material 140 in the first openings 136, and on the main surface 120 of the semiconductor die 104. This may be done by known bumping techniques, for example.

As shown in process step 1008, the solder material 130 is formed on top of the solder bumps 128. This may be done using a wave soldering technique, for example. According to this technique, the solder material 130 is heated to a melting temperature and applied in liquid state. The liquified solder material 130 may be formed in the desired locations using a pump, for example.

As shown in process step 1010. the encapsulant body 132 is formed. The encapsulant body 132 can be formed using various injection molding techniques such as compression molding, transfer molding, etc. According to these techniques, the assembly including the frame 102, semiconductor die 104 and solder bumps 128 is placed within a mold cavity and a liquified molding compound (e.g., a thermosetting plastic or epoxy) is injected into the cavity. The liquified molding compound fills the cavity until the main surface 120 of the semiconductor die 104 is covered with the molding compound. According to one technique, this molding process is controlled to form the upper surface 133 of the encapsulant body 132 with the first and second contact structures 106, 108 each being exposed from the upper surface 133 of the encapsulant body 132. That is, immediately after the molding process is complete, the first and second contact structures 106, 108 are exposed from the upper surface 133 of the encapsulant body 132. As a result, no further planarization steps are necessary to expose the first and second contact structures 106, 108. The encapsulant body 132 may be formed this way by specially tailoring the mold cavity and/or by controlling the injection to partially fill the mold cavity.

Figure 6:
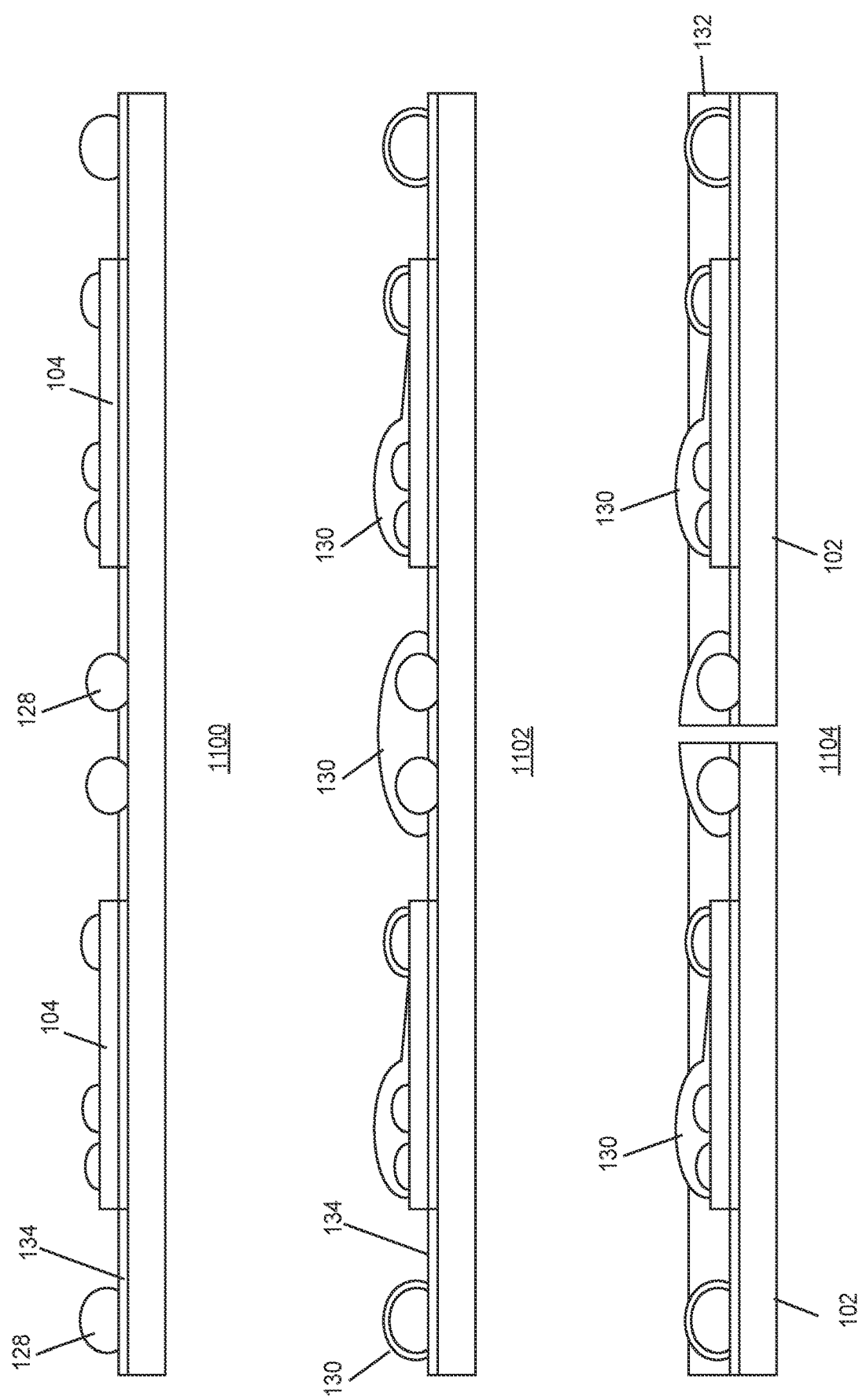
FIG. 6 depicts selected method steps in a method of producing a frame-mounted semiconductor die assembly, according to an embodiment.

Referring to FIG. 6, an example of a parallel processing technique for forming the frame-mounted semiconductor die assembly 100 described in FIGS. 3 and 4 is depicted, according to an embodiment.

As shown in process step 1100, a large panel is prepared with multiple die assemblies. Each die assembly has the configuration obtained by process step 1006. As shown in process step 1102, the solder material 130 is formed on top the solder balls 128 for each die assembly. This may be done according to the technique described in process step 1008. As shown in process step 1104, a molding process is performed to form the encapsulant body 132 for each die assembly. This may be done by performing the injection molding techniques described process step 1010, wherein the panel and/or multiple semiconductor dies 102 are placed within one mold cavity. After the molding compound cools and hardens, a dicing process is performed to singulate individual devices from the frame assembly. During this process, the mold compound and frame material are cut in order to separate each component from the frame. This dicing process may include techniques such as mechanical sawing or laser ablation, for example. The dicing process cuts the encapsulant body 132 and forms the frame 102 for each device.

In a variation of the embodiment described with reference to FIG. 7, the region between the two semiconductor dies 104 includes a larger solder ball 128 (relative to the other solder balls 128), and the solder material 130 is formed over this larger solder ball 128. This larger solder ball 128 is cut during the above described dicing process. The cut solder ball 128 provides an LTI (Lead Tip Inspection) feature, which can be advantageous, especially when soldering the device on PCB.

Referring to FIG. 7, an exemplary technique for forming the first contact structure 106, according to an embodiment. In this figure, the first layer 134 of solder resist material is omitted for illustration purposes. As shown in process step 1200, a plurality of the solder balls 128 are formed on the frame 102 around the semiconductor die 104. Additionally, the solder balls 128 are formed on the second terminal 118 and the control terminal 122. As shown in process step 1202, the solder material 130 is formed on the solder balls 128. The distance between immediately adjacent solder balls 128 is selected so that a single node connection is formed by solder material 130. That is, the solder balls 128 are spaced apart in a way that maintains a monolithic region of the solder material 130 intact. As shown in process step 1204, the frame 1204 is cut at a location that is between a group of solder balls 128 covered by the solder material 130.

Referring to FIG. 8, two different techniques for forming the first contact structure 106 are shown. According to the technique shown in FIG. 8A, the first layer 134 of solder resist material is structured such that the first openings 136 are approximately the size of one copper ball 128. Subsequently, each of the first openings 136 are completely filled with the conductive adhesive material 140. Subsequently, the solder material 130 is formed on top of the balls 128. According to the technique shown in FIG. 8B, the first layer 134 of solder resist material is structured such that the first openings 136 are approximately the size of at least two least two of the balls 128. The first openings 136 are partially filled with regions of the conductive adhesive material 140. Subsequently, the balls 128 are formed on the conductive adhesive material 140. The solder material 130 is then formed on top of the balls 128. Due to the larger sized openings, some of the solder material 130 reaches the surface of the frame 102.

Referring to FIG. 9, the frame-mounted semiconductor die assembly 100 is mated with another element to provide a discrete packaged semiconductor device, according to two different embodiments.

In the embodiment of FIG. 9A, the semiconductor device further includes a lead frame 300 that is mated with the first, second and third contact structures 106, 108, 126 at the upper surface 133 of the encapsulant body 132. In this embodiment, the lead frame 300 includes first and second terminal pads 302, 304 that are spaced apart from one another, and a control terminal pad 306. The lead frame 300 structure is incorporated into or attached to the frame-mounted semiconductor die assembly 100 such that the first terminal pad 302, the second terminal pad 304 and the control terminal pad 306 are respectively electrically connected to the first, second and third contact structures 106, 108, 126. In one example, this arrangement is obtained by initially attaching the lead frame 300 and assembly before molding, e.g., as prepared by process step 1008, and subsequently performing the molding process as described in process step 1010. In another example, this arrangement is obtained by first performing the molding process, e.g., as performed in process step 1010, and subsequently attaching the lead frame 300 to the upper surface 133 of the encapsulant body 132.

In the embodiment of FIG. 9B, the semiconductor device further includes a circuit board 400 that is mated with the first, second and third contact structures 106, 108, 126 at the upper surface 133 of the encapsulant body 132. The circuit board 400 may include one or more layers of metallization (e.g., copper) and an electrically insulating substrate. The substrate may include typical PCB insulation materials, e.g., pre-impregnated composite fiber such as FR-4. In this embodiment, the circuit board 400 includes first and second terminal pads 402, 404 that are spaced apart from one another, and a control terminal pad 406. Each of these terminal pads 402, 404 and 406 are electrically isolated from one another by the substrate material and may be routed to other points of electrical contact by conductive traces formed in the circuit board 400. Moreover, as shown, these terminal pads 402, 404 and 406 may be connected to corresponding pads at an opposite side of the circuit board, thereby providing an I/O interface for a packaged device.

The circuit board 400 is incorporated into or attached to the frame-mounted semiconductor die assembly 100 such that the first terminal pad 402 the second terminal pad 404 and the control terminal pad 406 are respectively electrically connected to the first, second and third contact structures 106, 108, 126. In one example, this arrangement is obtained by initially attaching the circuit board 400 to an assembly before molding, e.g., as prepared by process step 1008, and subsequently performing the molding process as described in process step 1010. In another example, this arrangement is obtained by first performing the molding process, e.g., as performed in process step 1010, and subsequently attaching the circuit board 400 to the upper surface 133 of the encapsulant body 132.

Figure 10:
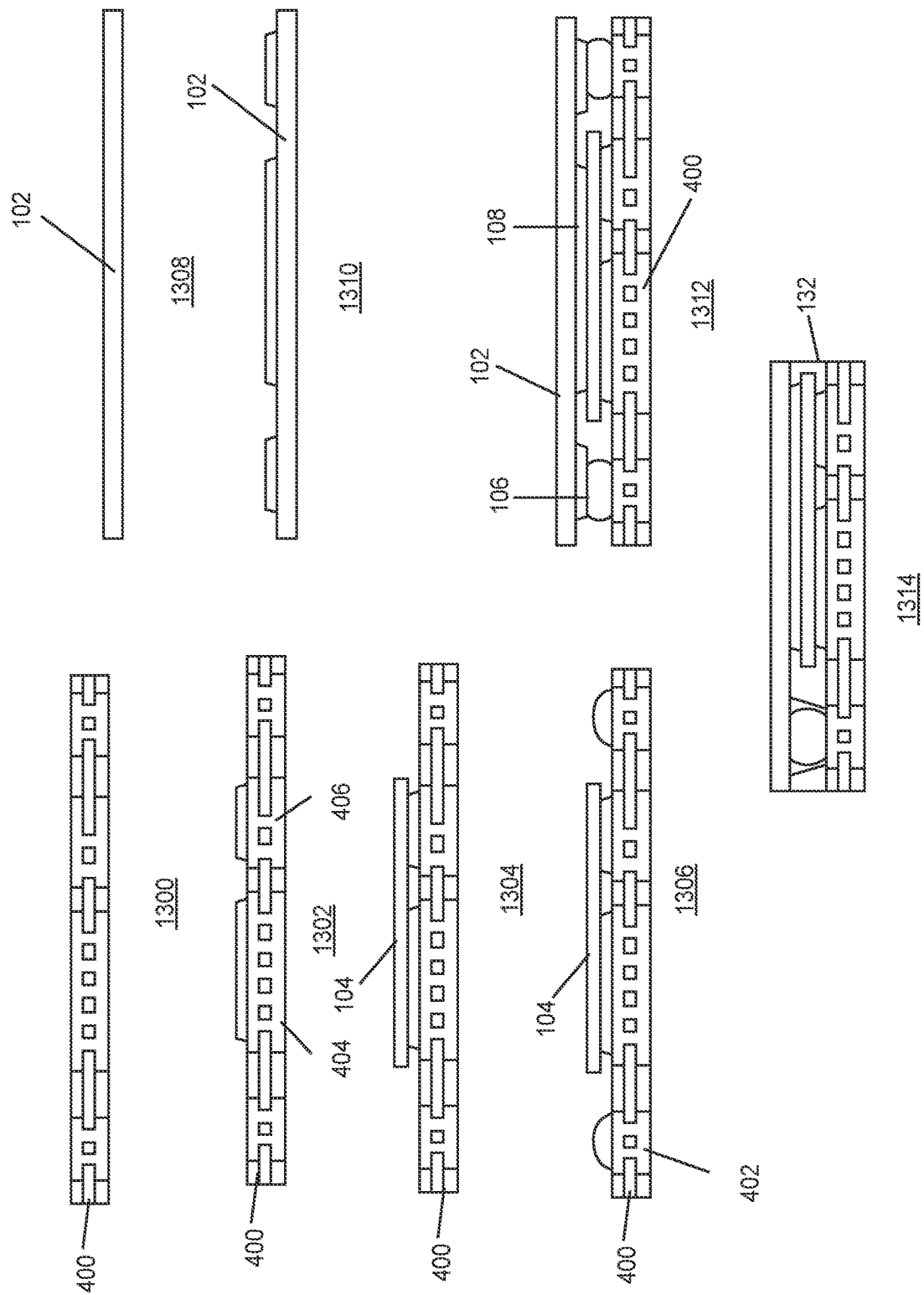
FIG. 10 depicts selected method steps in a method of producing a frame-mounted semiconductor die assembly of FIG. 9B, according to an embodiment.

Referring to FIG. 10, a technique for forming the semiconductor device of FIG. 9B is depicted, according to an embodiment.

As shown in process step 1300, the circuit board 400 is initially provided. Subsequently, in process step 1302, a conductive adhesive (e.g., solder) is formed on the second terminal pad 404 and the control terminal pad 406. This may be done by a stencil printing technique, for example. Subsequently, as shown in process step 1304, the semiconductor die 104 is attached to the circuit board 400, thereby forming a mechanical and electrical connection between the second terminal pad 404 and the control terminal pad 406 and the terminals of the semiconductor die. This may be done by a reflow of solder material, for example. Subsequently, as shown in process step 1306, solder bumps are formed on the first terminal pad 402 of the circuit board 400, e.g., by a bump bonding process.

Meanwhile, process steps 1308 and 1310 depict a preparation of the frame 102 that may be performed concurrently with process steps 1300-1306. As shown in process step 1308, the frame 102 is provided. As shown in process step 1310, regions of conductive adhesive (e.g., solder) are formed on the frame 102. This may be done by a stencil printing technique, for example. As shown in process step 1312, the assembly created by process step 1306 is combined with the assembly created process step 1310. According to this technique, the conductive adhesive of the frame 102 is adhered to the solder balls on the circuit board 400. A solder reflow step may be performed to form stable connections. In this assembly, the first contact structures 106 are provided by the solder balls applied to circuit board 400 and the conductive adhesive formed on the frame 102. and the second contact structures 108 are provided exclusively by the conductive adhesive formed on the frame 102.

As shown in process step 1314, a molding process is performed to form the encapsulant body 132. The molding process fills a space between the circuit board and the conductive frame 102 with an electrically insulating molding compound.

Figure 11:
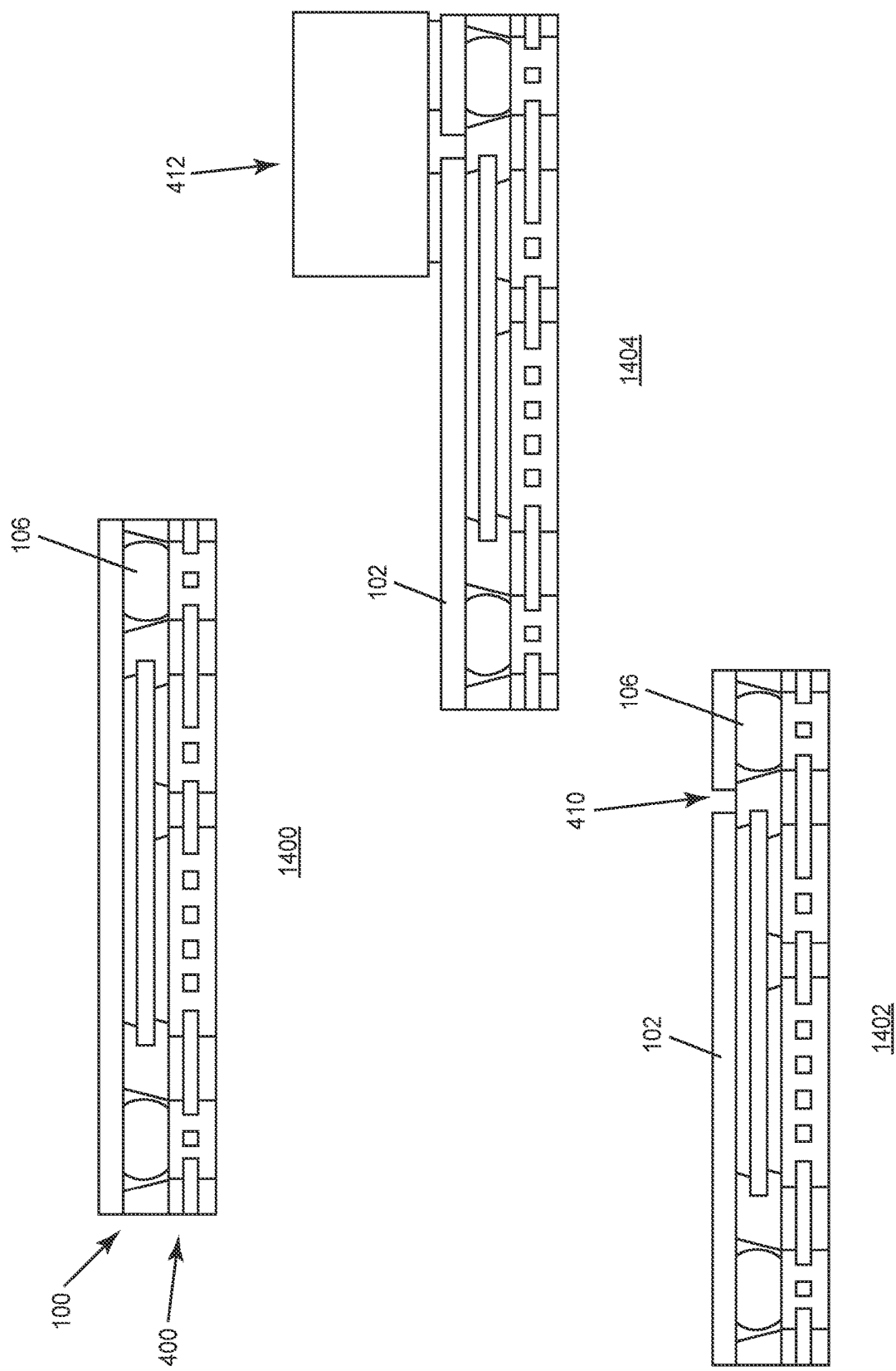
FIG. 11 depicts selected method steps for attaching an additional electronic component to a frame-mounted semiconductor die assembly, according to an embodiment.

Referring to FIG. 11, an optional technique for mounting a discrete component 412 directly on the frame-mounted semiconductor die assembly 100 of FIG. 9B is depicted, according to an embodiment. As shown in process step 1400, the frame-mounted semiconductor die assembly 100 mated with the circuit board 400 is provided. Subsequently, as shown in process step 1402, a cut 410 is formed in the frame portion of frame-mounted semiconductor die assembly 100. This may be done by a mechanical sawing process, for example. The cut 410 is formed to electrically isolate a section of the frame 102 that is conductively connected to the first contact structure 106. That is, the cut 410 removes the electrical connection between the first terminal 114 and a portion of the frame 102 directly contacting the first contact structure 106. Subsequently, as shown process step 1404, a further electronic component 412 is mounted on the frame 102. As shown, the electronic component 412 has two bond pads, with one bond pad being electrically connected to the isolated portion of the frame 102 and the other bond pad being electrically connected to the remaining portion of the frame 102. As a result, the electronic component 412 is mounted in series between the first terminal 114 and the first contact structure 106.

Generally speaking, the electronic component 412 can have a wide variety of device configurations. For example, the electronic component 412 can be a passive component, such as a resistor or inductor, that is used to introduce resistance or inductance into the load path of the device for enhanced performance with respect to switching speed, power dissipation, etc. Alternatively, the electronic component 412 can be an active component that is configured to perform a separate function.

Referring to FIG. 12, an implementation of the frame-mounted semiconductor die assembly 100 described with reference to FIGS. 1-2 is depicted, according to an embodiment. In this embodiment, the frame 102 is configured as a substantially flat and uniform thickness piece of metal. In this embodiment, the first contact structures 106 include a plurality of conductive bond balls 142 that are formed directly on the die attach surface 112 of the frame 102. The conductive bond balls 142 may include a conductive metal such as copper, gold, silver, etc. The first contact structures 106 additionally include a solder material 144, e.g., tin or lead based solder, covering the conductive bond balls 142. In one embodiment, the second and third contact structures 108, 126 are provided exclusively by the solder material 144.

The electrical isolation structure 110 of this frame-mounted semiconductor die assembly 100 is provided by a layer or layers of solder resistant material that are formed directly on the die attach surface 112 at least in the lateral region between the first contact structure 106 and the semiconductor die 104. Exemplary solder resistant material include epoxy liquids, liquid photoimageable solder mask (LPSM or LPI) inks and dry-film photo-imageable solder mask (DFSM). In addition to being formed on the frame 102, the solder resistant material can be formed to conformally encapsulate the semiconductor die 104, and hence provide insulation and protection. In some embodiments, the solder resistant material is formed exclusively on the die attach surface 112, and is not formed on the rear surface 113. This arrangement allows for enhanced thermal dissipation. For example, thermal interfacing material can be applied on an exposed rear surface 113 so that an additional heat sink can be attached for enhanced thermal dissipation performance.

According to an embodiment, the frame-mounted semiconductor die assembly 100 includes a turret 146 disposed in the lateral space between the semiconductor die 104 and the first contact structure 106. The turret 146 is an electrically insulating structure that does not contribute to the electrical functionality of the frame-mounted semiconductor die assembly 100. Instead, the turret 146 is configured to provide a fixed vertical separation between the main surface 120 of the semiconductor die 104 and the upper surface of the circuit board 200 when the frame-mounted semiconductor die assembly 100 is mated to the circuit board 200 as shown in FIG. 12B. The turret 146 provides mechanical support that prevents the semiconductor die 104 from moving too close to the circuit board 200, e.g., during reflow of the solder material. To this end, the turret 146 may include an electrically insulating material that maintains rigidity during solder reflow temperatures, e.g., greater than 300° C., 400° C., 500° C., etc. In a particular embodiment, the turret 146 includes a solder resist material. This solder resist material may be the same material as the electrical isolation structure 110.

According to a specific embodiment, the turret 146 is a pyramid shaped structure of multiple layers of solder resist material that are successively stacked on top of one another, and have a gradually decreasing area moving away from the die attach surface 112. More generally, the turret 146 may have a wide variety of shapes and material types. For example. the turret 146 could be circular or rectangular in cross section, or have a more complex shape. According to an embodiment, the turret 146 extends past the plane 124 of the main surface 120 of the semiconductor die 104. In a particular example, an upper end of the turret 146 to a second plane 127 that is coplanar with the upper surfaces of the first and second contact structures 106, 108. In this way, the turret 146 provides a contact point that comes into direct contact with the circuit board 200 when the frame-mounted semiconductor die assembly 100 is mated a circuit board as shown in FIG. 12B.

The first contact structure 106 may be configured to provide a fixed vertical separation between the main surface 120 of the semiconductor die 104 and the upper surface of the circuit board 200 in a similar manner as the turret 146 described above. In an example of this concept, the conductive bond balls 142 of the first contact structure 106 are configured to maintain rigidity under typical solder temperatures, e.g., greater than 300° C., 400° C., 500° C. etc. In this way, as the solder material 144 of the first, second and third contact structures 106, 108 and 126 becomes liquified, the conductive bond balls 142 maintain rigidity and keep the semiconductor die 104 at adequate separation distance from the circuit board 200. Various embodiments of the frame-mounted semiconductor die assembly 100 may include either one or both of this first contact structure 106 configuration and the turret 146 to provide this fixed vertical separation distance.

Advantages of the frame-mounted semiconductor die assembly 100 described with reference to FIG. 12 include the ability to form the electrical isolation structure 110 from a thin layer of solder material, which can be formed by a batch processing technique, such as jet printing, spray coating, silkscreening, etc. By omitting mold compound, less stresses (e.g., from thermal expansion of the material) are placed on the assembly during manufacture. Moreover, the turret 146 serves to lock in place a stand-off height between the semiconductor die 104 and end customer's circuit board. This improves the reliability of the device in temperature cycling by allowing more distance between the semiconductor die 104 and circuit board to accommodate the CTE (coefficient of thermal expansion) mismatch between the two materials.

Figure 13:
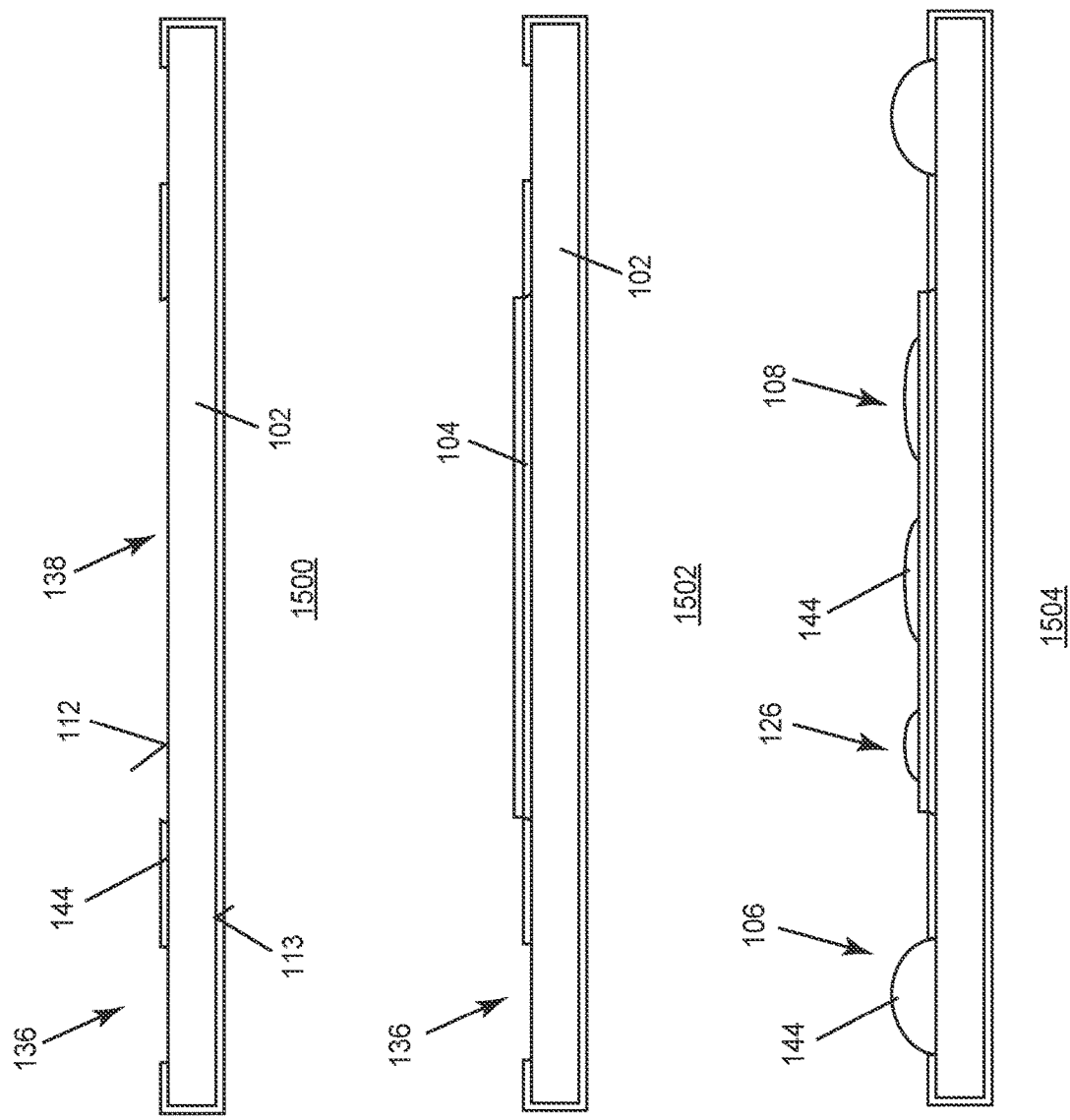
FIG. 13 depicts selected method steps in a method of producing a frame-mounted semiconductor die assembly, according to an embodiment.

Referring to FIG. 13, a method for producing the frame-mounted semiconductor die assembly 100 described with reference to FIG. 12 is depicted, according to an embodiment. This method represents a simple and low-cost option for forming the device with minimal processing steps.

In a first process step 1500, the conductive frame 102 is provided. This may be done according to the process step 1000 as previously described. Subsequently, a first layer 134 of solder resist material is formed at least on one side of the frame 102. In the depicted embodiment, the first layer 134 of solder resist material is formed on edge sides and a rear surface 113 of the frame 102 to form an encapsulating structure. Alternatively, the first layer 134 of solder resist material may be formed exclusively on the die attach surface 112. The first layer 134 of solder resist material is structured to include first and second openings 136, 138, which each expose the die attach surface 112 of the frame 102. This arrangement of the first layer 134 of solder resist material can be obtained by a direct selective formation technique. Specifically, a silkscreening technique can be performed to selectively block the formation of the first solder material in certain areas. In another specific example, the structured first layer 134 of solder resist material can be printed, e.g., by jet printing in designated areas. In another embodiment, the structured first layer 134 of solder resist material can be formed by a subtractive process. Specifically, the first layer 134 of solder resist material can initially be formed as a blanket layer that completely coats the frame 102. Subsequently, the first and second openings 136, 138 are formed by removing regions of the solder material, e.g., by laser ablation or UV exposure.

In a second process step 1502, the semiconductor die 104 is mounted on and electrically connected to the frame 102 in the second opening 138. This may be done by the previously described process step 1004, for example.

In a third process step 1504, the solder material 144 is formed in the first openings 136. This may be done by applying the solder material 144 in a liquified state, e.g., by a stenciling or jetting technique, for example. In this version of the device, the first, second and third contact structures 106, 108 and 126 are formed exclusively from solder material.

Figure 14:
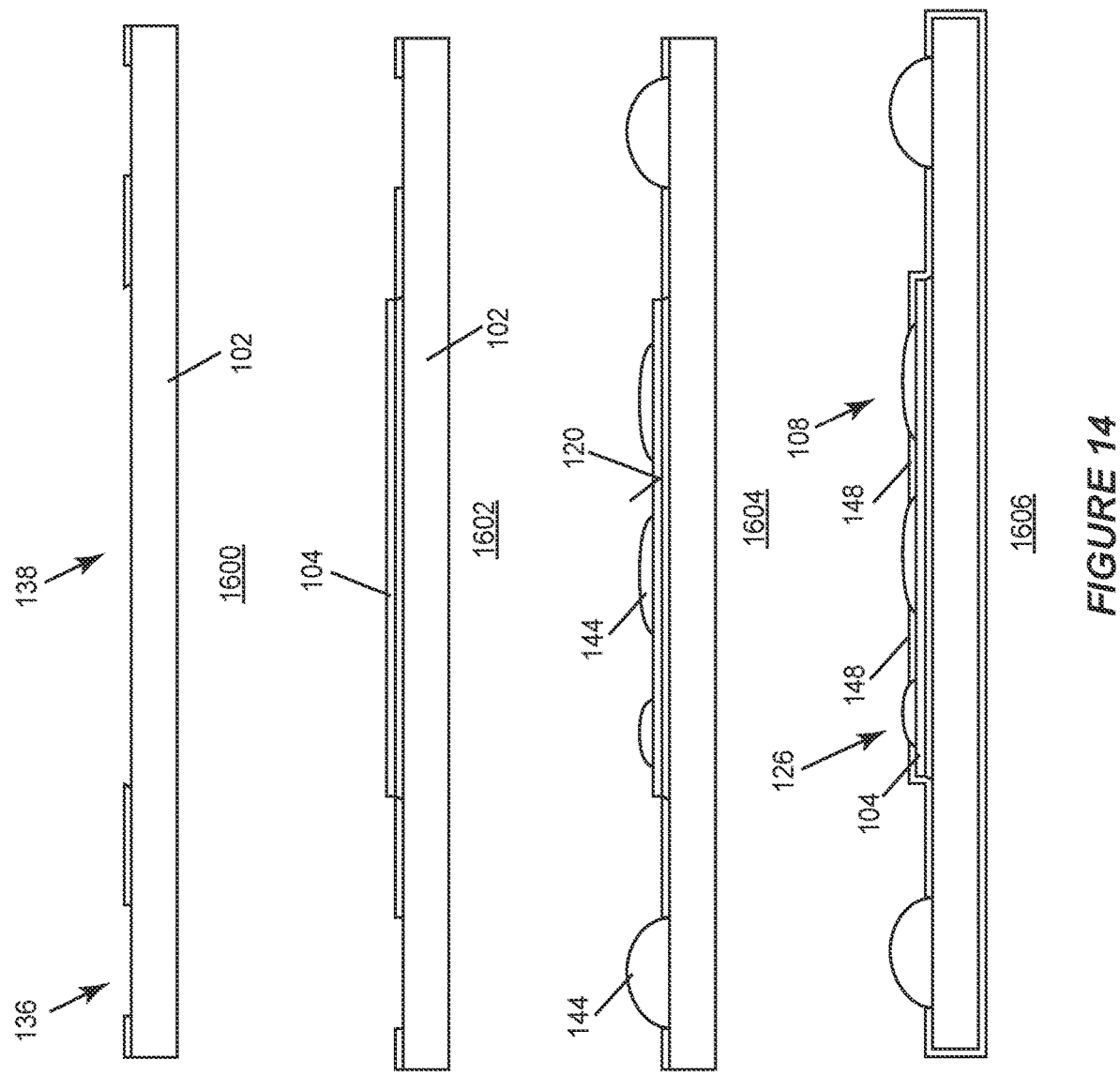
FIG. 14 depicts selected method steps in a method of producing a frame-mounted semiconductor die assembly, according to an embodiment.

Referring to FIG. 14, a method for producing the frame-mounted semiconductor die assembly 100 described with reference to FIG. 12 is depicted, according to an embodiment. This method forms solder resist material on the main surface 120 of the semiconductor die 104 between the second and third contact structures 108, 126. This may be advantageous to prevent electrical shorting of the terminals and/or improve protection of the device.

In a first process step 1600, the conductive frame 102 is provided and the first layer 134 of solder resist material is provided with the first and second openings 136, 138. This can be done according to the previously described process step 1000, for example.

In a second process step 1602, the semiconductor die 104 is mounted on and electrically connected to the frame 102 in the second opening 138. This may be done by the previously described process step 1004, for example.

In a third process step 1604, the solder material 144 is formed in the first openings 136. This may be done by applying the solder material in a liquified state, e.g., by a stenciling or jetting technique, for example.

In a fourth process step 1606 a second layer 148 of solder resistant material is formed. The second layer 148 of solder resist material can be formed according to any of the techniques for forming the first layer 134 of solder resist material in the previously described embodiments. The second layer of solder resistant material 148 formed on edge sides and the main surface 120 of the semiconductor die 104. Optionally, the second layer of solder resistant material 148 can be formed on edge sides and a rear surface 120 of the conductive frame 102.

Figure 15:
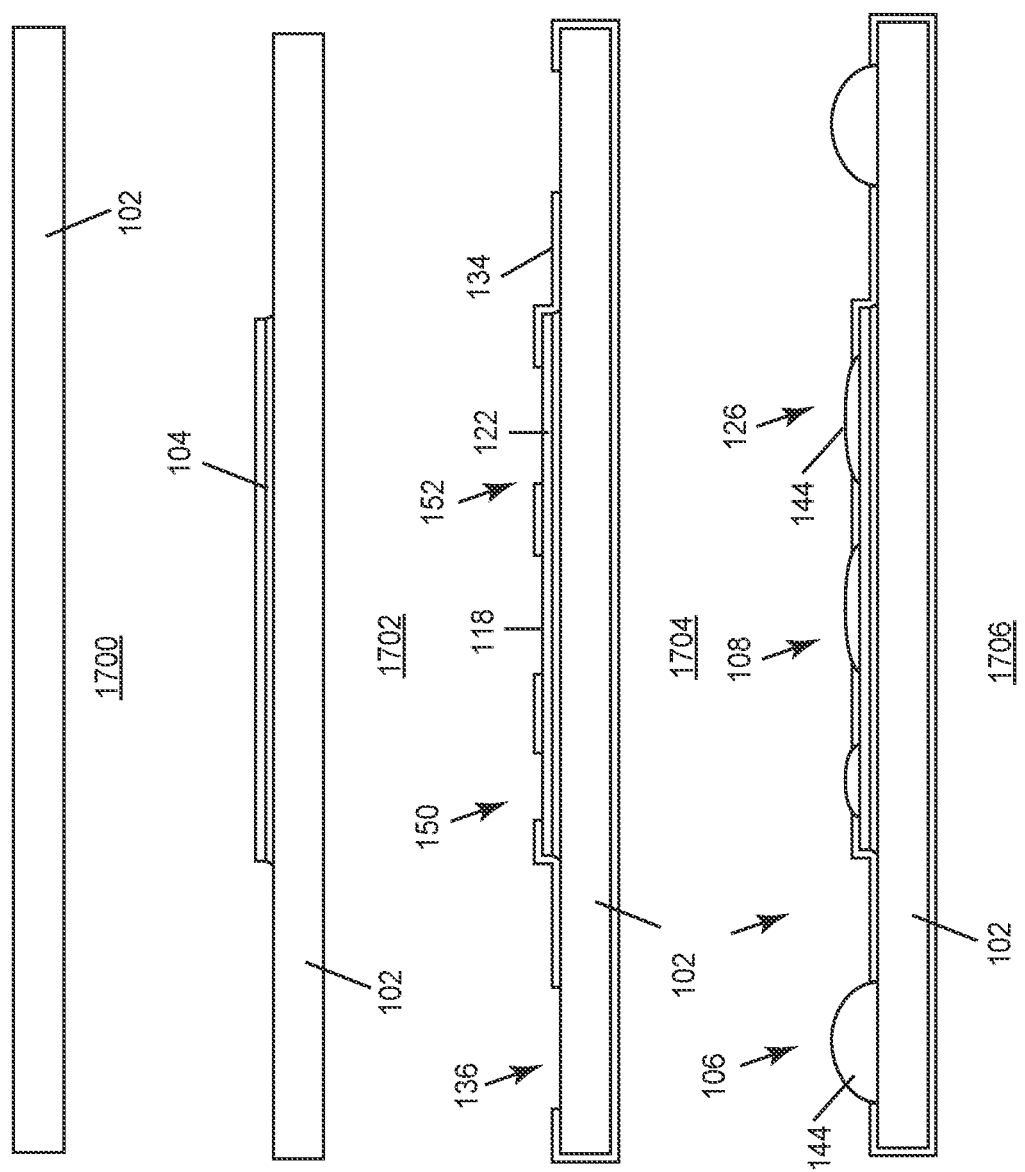
FIG. 15 depicts selected method steps in a method of producing a frame-mounted semiconductor die assembly, according to an embodiment.

Referring to FIG. 15, a method for producing the frame-mounted semiconductor die assembly 100 described with reference to FIG. 12 is depicted, according to an embodiment. This method forms the same device as the previously described method of FIG. 14, but with a different sequence of steps. Specifically, as illustrated in process steps 1700 and 1702, the semiconductor die 104 is mounted and electrically connected to the frame 102 immediately after providing the frame 102. Subsequently, as illustrated in process step 1704, the first layer 134 of solder resistant material is formed on the conductive frame 102 and on the semiconductor die 104. This may be done according to any of the previously described techniques for forming the first layer 134 of solder resist material. The first layer 134 of solder resist material is formed to include the first openings 136 exposing the die attach surface 112 of the frame 102. Additionally, third and fourth openings 150 and 152 are formed in the first layer 134 of solder resist material to expose the second terminal 118 and the control terminal 122, respectively, of the semiconductor die 102. Subsequently, as shown in process step 1706, the first, third and fourth openings 136, 150, and 152 are filled with a solder material, thereby forming the first, second, and third conductive contact structures 106, 108, 126. respectively. This may be done by applying the solder material in a liquified state, e.g., by a stenciling or jetting technique.

Referring to FIG. 16, a method for producing the frame-mounted semiconductor die assembly 100 described with reference to FIG. 12 is depicted, according to an embodiment. This method includes process steps substantially similar to the technique described with reference to FIG. 15 and includes an additional processing step for forming the conductive bond balls 142 of the first contact structure 106. Specifically, the method of FIG. 15 includes process steps 1800, 1802, 1804 and 1808 which may be performed in an identical manner as the previously described process steps 1700, 1702, 1704, 1706, respectively. According to process step 1806, after attaching the semiconductor die 104 to the frame 102 and before forming the first layer 134 of solder resist material, the conductive bond balls 142 are formed in the first openings 136. This may be done by known bumping techniques, for example. When process step 1808 is performed, the conductive bond balls 142 are covered with the solder material.

Referring to FIG. 17, a method for producing the frame-mounted semiconductor die assembly 100 described with reference to FIG. 12 is depicted, according to an embodiment. This method produces the semiconductor die 104 assembly to include the turret 146. The method includes process steps 1900, 1902 and 1906, which may be performed in an identical manner as the previously described process steps 1700, 1702 and 1706. According to process step 1904, the first layer 134 of solder resist material is formed in a similar manner as previously described. Subsequently, the turrets 146 are formed directly on the first layer 134 of solder resist material at a location that is between the first openings 136 and the semiconductor die 104. According to one technique, the turrets 146 are formed by making repeated passes with a solder resist fetter, wherein each pass produces one level of the turret 146. Each successive level of the solder resist material may have a smaller area than the previous one. By appropriately selecting the area of the base solder resist layer from the first pass and/or by selecting the size reduction for each pass, the height of the turret 146 can be controlled.

Referring to FIG. 18, an implementation of the frame-mounted semiconductor die assembly 100 described with reference to FIGS. 1-2 is depicted, according to an embodiment. In this embodiment, the frame 102 is a formed structure. That is, the frame 102 has been formed from a flat structure with an intentionally formed geometry. In the depicted example, the frame 102 has a bowed shape. Specifically, the frame 102 includes a substantially flat central die attach portion 154, and an end connector portion 156 that bends away from the central die attach portion 154. The central die attach portion 154 includes a substantially planar die attach surface 112 which accommodates the mounting and electrical connection of a semiconductor die 104 in a similar manner as the previously described embodiments. The end connector portion 156 curves away from the away from the central die attach surface 112 (in the downward direction in the figure).

The frame-mounted semiconductor die assembly 100 includes a first contact surface 157 in the end connector portion 156. The first contact surface 157 is conductively connected to the first load terminal via the metal frame 102. In the depicted embodiment, the first contact surface 157 is provided by a first contact structure 106 that is formed on the end connector portion 156 and includes include a fusible conductive adhesive material 140, e.g., solder materials, sinter materials, conductive pastes, etc. Alternatively, the first contact surface 157 can be a provided by the surface of the frame 102 or a plating material silver or nickel material) formed on the surface of the frame 102.

The frame 102 may be sufficiently bent such that the first contact surface 157 at the plane 124 of the main surface 120 of the semiconductor die 104. Put another way, the surface of the end connector portion 156 may be offset from the die attach surface 112 by a distance that is at least close to the thickness of the semiconductor die 104. In this way, the first contact structure 106 can easily be formed to reach or extend past the plane 124 of the main surface 120 of the semiconductor die 104. Meanwhile, the second and third conductive contact structures 108, 126 can be provided from a fusible conductive adhesive material 140 applied on the rear surface 120 of semiconductor die 104 in a similar manner as previously described.

According to an embodiment, the first contact surface 157 extends past the second contact and third conductive contact structures 108, 126. That is, the first contact surface 157 is further away from the main surface of the semiconductor doe 104 than an outermost surface of the second contact and third conductive contact structures 108, 126. This configuration helps reduce the risk of mechanical damage to the semiconductor die 104 during component placement by ensuring that first contact surface 157 act a positive stop during placement.

In the embodiment of FIG. 18, the electrical isolation structure 110 is provided by an electrically insulating coating layer 155, which conformally encapsulates the semiconductor die 104. Optionally, the electrically insulating coating layer 155 may cover the frame 102 as well. Generally speaking, the coating layer 155 can include any of a wide variety of electrically insulating materials which can be spray coated, dipped, jet printed, etc. to encapsulate the entire device. Examples of these materials include epoxy liquids and solder resist materials such as liquid photoimageable solder mask (LPSM or LPI) inks, for example. The coating layer 155 is formed such that the fusible conductive adhesive material 140 of the first, second and third conductive contact structures 106, 108 126 protrudes out of the electrically insulating coating layer 155.

Figure 19:
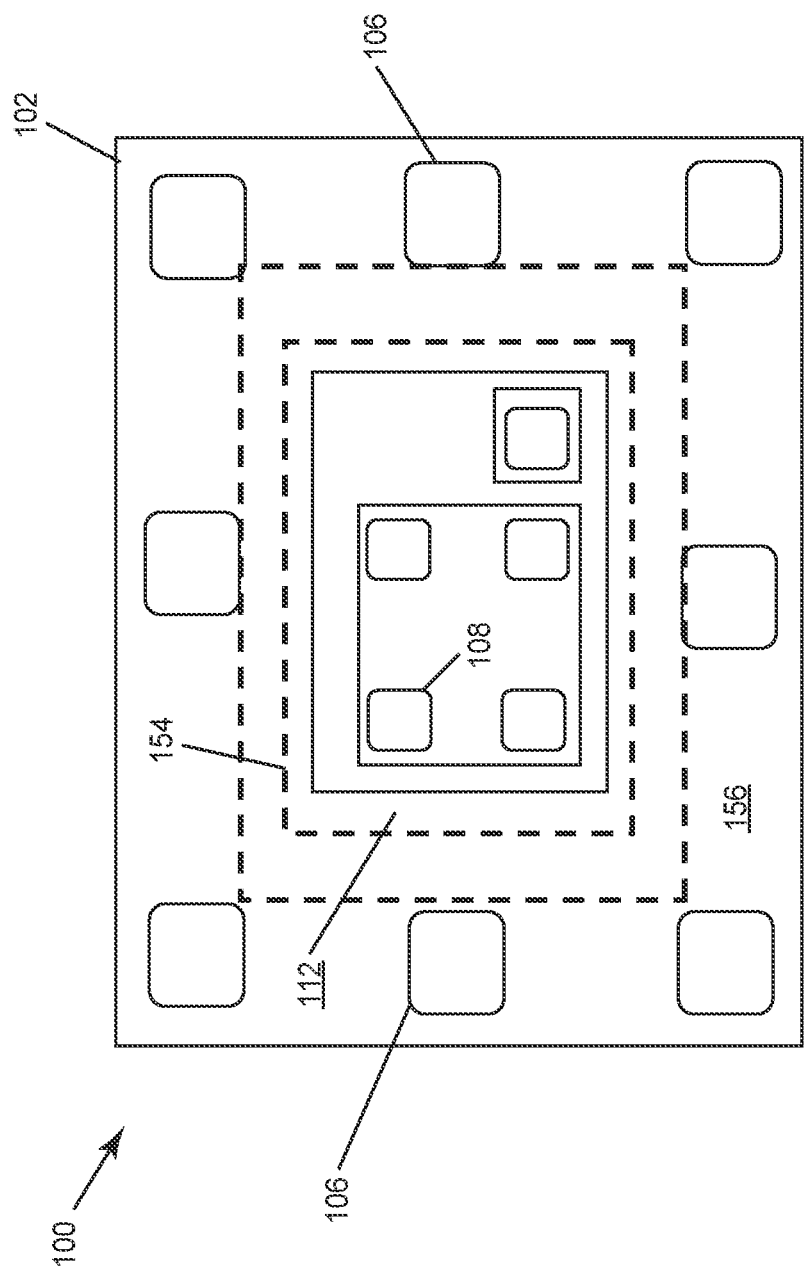
FIG. 19 depicts a planar view of a frame-mounted semiconductor die assembly, according to an embodiment.

Referring to FIG. 19 a planar top-side view of the of the frame-mounted semiconductor die assembly 100 is depicted. As can be seen, the die attach surface 112 is provided in a central region of the frame 102, with the end connector portion 156 forming an enclosed ring that surrounds the central die attach portion 154. Like the previously described embodiments, the die attach surface 112 of the frame 102 has a greater area than the semiconductor die 104, and the semiconductor die 104 is affixed to the die attach surface 112 of the frame 102 such that the die attach surface 112 laterally extends past the semiconductor die 104 in every direction. Multiple ones of the first contact structures 106 are formed in a pattern that surrounds the semiconductor die 104. In embodiments different from what is shown, the first contact structures 106 may be disposed only on some sides of the semiconductor die, thereby allowing for a smaller footprint, as previously described.

Referring to FIG. 20, a method for producing the frame-mounted semiconductor die assembly 100 described with reference to FIGS. 18-19 is depicted, according to an embodiment. In process step 2000 shown in FIG. 20A, the frame 102 is provided. The frame 102 can be provided from substantially uniform thickness piece of sheet metal, e.g., in a similar manner as the previously described process step 100. The initially flat piece of metal can be formed into the bent geometry with the end connector portion 156 bending away from the central die attach portion 154 using techniques such as bending, punching, stamping, etc. Before or after the bending, the semiconductor die 104 may be affixed and electrically connected to the die attach surface 112 using a conductive adhesive in a similar manner as the previously described process step 1004, for example. After mounting the semiconductor die 104, the coating layer 155 is applied to exposed surfaces of the semiconductor die 104 and frame 102. This may be done by a jet-printing technique, for example. In this case, the coating layer 155 is selectively printed to include first openings 136 that expose the upper surface of the frame 102 in the end connector portion 156 and third and fourth openings 150 and 152 that respectively expose the second terminal 118 and the control terminal 122 of the semiconductor die 102. In process step 2002 shown in FIG. 20B, the fusible conductive adhesive material 140 is formed. In the depicted embodiment, the fusible conductive adhesive material 140 is formed in the first, third and fourth openings, 136, 150 and 152, e.g., in a similar manner as the previously described process step 1006, so as to form each of the first, second and third conductive contact structures 106, 108 and 126. As previously mentioned, the fusible conductive material 140 may be omitted from the end connector portion 156 so that a first contact surface 157 is provided from the surface of the frame 102, or a metal plating layer formed thereon.

Figure 21:
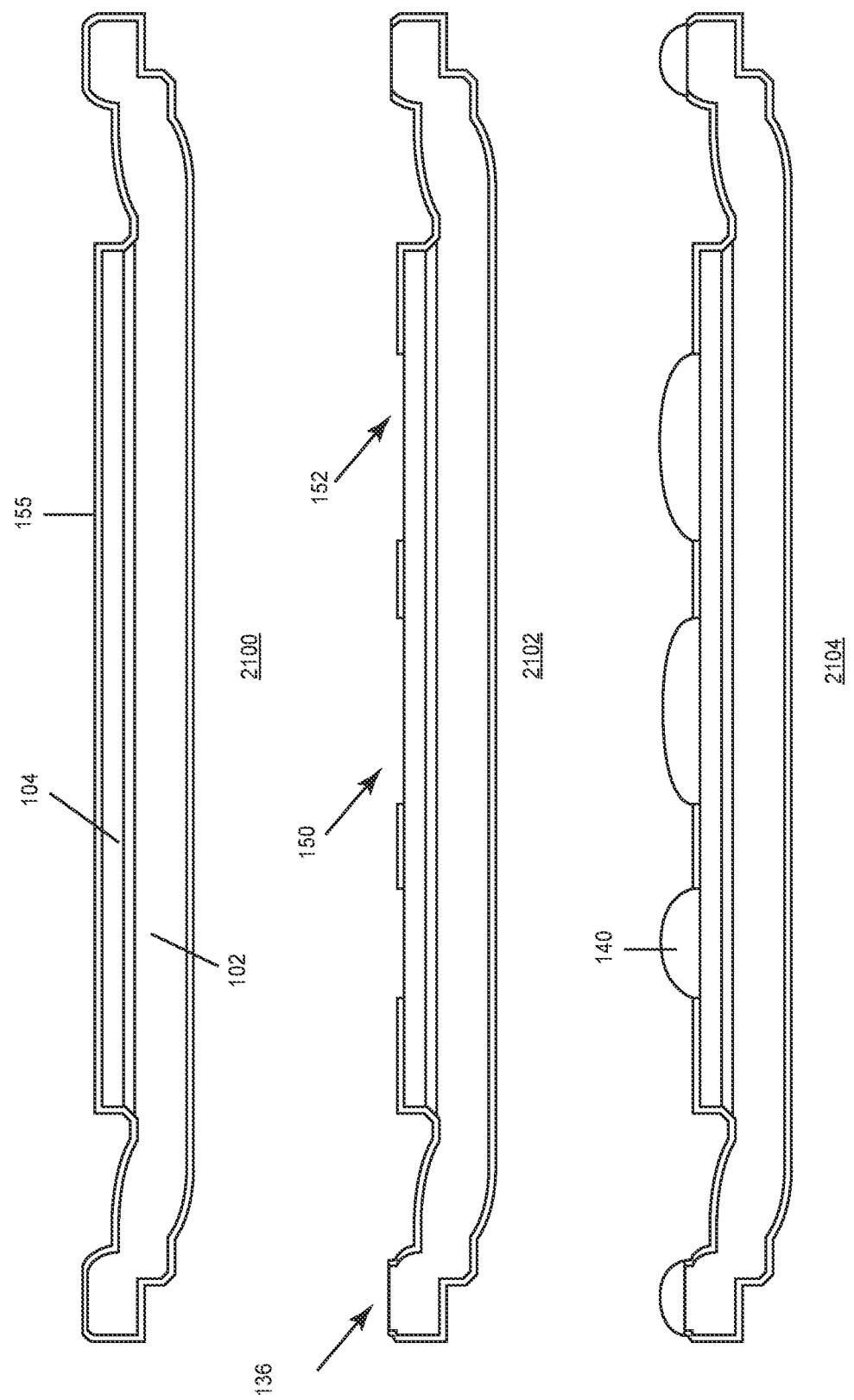
FIG. 21 depicts selected method steps in a method of producing a frame-mounted semiconductor die assembly, according to an embodiment.

Referring to FIG. 21, a method for producing the frame-mounted semiconductor die assembly 100 described with reference to FIGS. 18-19 is depicted, according to an embodiment. Process step 2100 is substantially similar to process step 2000, except that the coating layer 155 is initially formed to completely encapsulate the semiconductor die 104 and frame 102. That is, the coating process covers all exposed surfaces. The coating layer 155 may be formed by a jet-printing technique or by dip coating the assembly in a bath of the coating material, for example. Subsequently, in process step 2102, the first, third and fourth openings 136, 150 and 152 are formed by selectively removing portions of the coating layer 155. According to one technique, this is done by a masked etching process whereby the selected locations are exposed to ultraviolet light. According to another technique, this is done by a laser ablation process. In process step 2104, the fusible conductive adhesive material 140 is formed in first, third and fourth openings 136, 150 and 152, e.g., in a similar manner as the previously described process step 1006.

Figure 22:
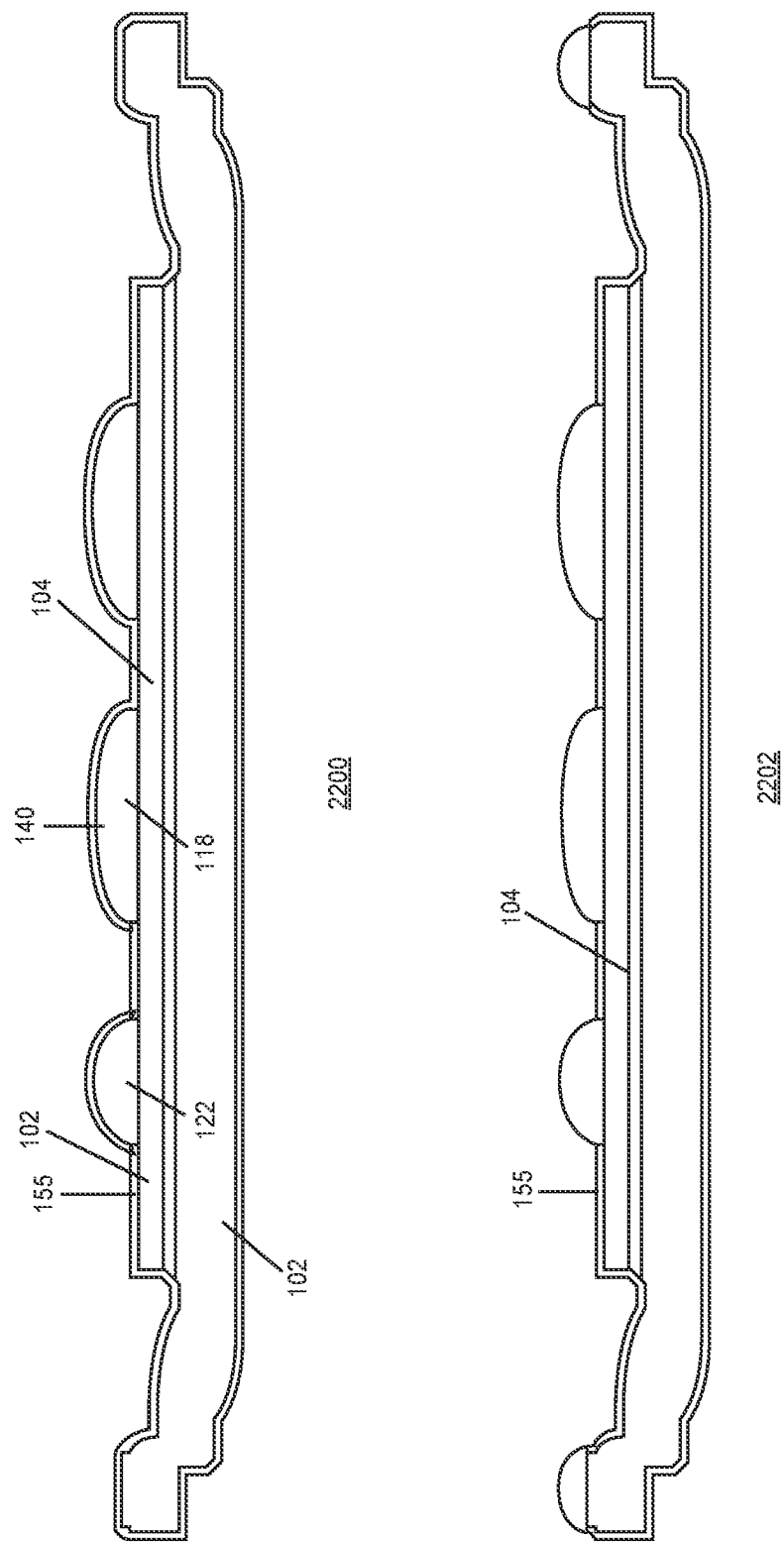
FIG. 22 depicts selected method steps in a method of producing a frame-mounted semiconductor die assembly, according to an embodiment.

Referring to FIG. 22, a method for producing the frame-mounted semiconductor die assembly 100 described with reference to FIGS. 18-19 is depicted, according to an embodiment. According to process step 2200, an assembly that includes the frame 102 and the semiconductor die 104 mounted and electrically connected to the frame 102 is provided. Before forming the coating layer 155, the fusible conductive adhesive material 140 is formed on the second terminal 118 and the control terminal 122 of the semiconductor die 104, e.g., in a similar manner as the previously described process step 106. Subsequently, the coating layer 155 is formed by a jet-printing technique or by dip coating the assembly in a bath of the coating material, for example. Hence, the coating layer 155 covers the fusible conductive adhesive material 140 as well. Subsequently in process step 2202, the regions of the coating layer 155 that cover fusible conductive adhesive material 140 are removed. According to one technique, this is done by a masked etching process whereby the coating layer 144 is selectively removed by exposure to ultraviolent (UV) energy. According to another technique, this is done by a laser ablation process whereby the coating is exposed to a high energy laser beam.

The term "substantially" as used herein encompasses absolute conformity with the specified requirement as well as minor deviations from absolute conformity with the requirement due to manufacturing process variations, assembly, and other factors that may cause a deviation from the design goal. Provided that the deviation is within process tolerances so as to achieve practical conformity and the components described herein are able to function according to the application requirements, the term "substantially" encompasses any of these deviations.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
a conductive frame comprising a die attach surface that is substantially planar;
a semiconductor die comprising a first terminal disposed on a rear surface of the semiconductor die and a second terminal disposed on a main surface of the semiconductor die that is opposite the rear surface;
a first conductive contact structure disposed on the die attach surface with a lateral separation between the first conductive contact structure and the semiconductor die; and
a second conductive contact structure on the main surface of the semiconductor die;
wherein the semiconductor die is mounted to the die attach surface such that the first terminal faces and is electrically connected to the conductive frame,
wherein the first conductive contact structure is configured as a point of electrical contact to the first terminal via the frame,
wherein the second conductive contact structure is configured as a point of electrical contact to the second terminal,
wherein the first conductive contact structure vertically extends past a plane of the main surface of the semiconductor die,
wherein the first conductive contact structure is electrically isolated from the main surface of the semiconductor die by an electrical isolation structure formed on the die attach surface, and
wherein an upper surface of the electrical isolation structure is below the main surface of the semiconductor die.

2. The semiconductor device of claim 1, wherein the die attach surface has a greater area than an areal footprint of the semiconductor die, and wherein the semiconductor die is affixed to the die attach surface such that the die attach surface laterally extends past the semiconductor die in every direction.

3. The semiconductor device of claim 2, further comprising a plurality of the first conductive contact structures each being formed on the die attach surface and each being configured as a point of electrical contact to the first terminal.

4. The semiconductor device of claim 2, wherein the frame has a substantially uniform thickness throughout an entire area of the frame.

5. The semiconductor device of claim 2, wherein the frame has a central die attach portion and an end connector portion, wherein the central die attach portion comprises the die attach surface, and wherein the end connector portion bends away from central die attach portion.

6. The semiconductor device of claim 2, wherein a thickness of the electrical isolation structure is less than a thickness of the semiconductor die.

7. The semiconductor device of claim 2, wherein the electrical isolation structure comprises a solder resistant layer that is formed directly on the die attach surface in a lateral region between the first contact structure and the semiconductor die.

8. The semiconductor device of claim 7, wherein the solder resistant layer conformally encapsulates the semiconductor die.

9. The semiconductor device of claim 7, wherein the solder resistant layer is formed only on one side of the frame that comprises the die attach surface.

10. The semiconductor device of claim 1, wherein the first conductive contact structure comprises a metal containing bump, stud or ball structure that is formed directly on the die attach surface, and a fusible conductive adhesive material that is formed around the metal containing bump, stud or ball structure.

11. The semiconductor device of claim 1, further comprising a turret of electrically insulating material disposed on the die attach surface between the first conductive contact structure and the semiconductor die, and wherein the turret vertically extends past the plane of the main surface of the semiconductor die.

12. The semiconductor device of claim 11, wherein the first and second contact structures reach a second plane that is offset from the plane of the main surface of the semiconductor die, and wherein an upper end of the turret is at least substantially coplanar with the second plane.

13. A semiconductor device, comprising:
a metal frame comprising a central die attach portion and an end connector portion, the central die attach portion comprising a substantially planar die attach surface, the end connector portion bending away from the central die attach surface;
a semiconductor die comprising a first terminal disposed on a rear surface of the semiconductor die and a second terminal disposed on a main surface of the semiconductor die that is opposite the rear surface; and
a first conductive contact surface in the end connector portion of the frame;
a second conductive contact structure formed on the main surface of the semiconductor die and comprising a fusible conductive adhesive material,
wherein the semiconductor die is affixed to the die attach surface with the rear surface of the semiconductor die facing the metal frame and the first terminal electrically connected to the metal frame,
wherein the first conductive contact surface is conductively connected to the first terminal via the metal frame,
wherein the first conductive contact surface is disposed on or above a plane of the main surface of the semiconductor die, wherein the second conductive contact structure is directly electrically connected to the second terminal, and wherein the semiconductor device further comprises an electrically insulating coating layer formed on the metal frame and semiconductor die, and wherein the fusible conductive adhesive material of the first and second conductive contact structures protrudes out of the electrically insulating coating layer.

14. The semiconductor device of claim 13, wherein the first conductive contact surface is provided by a fusible conductive adhesive material that is formed on an upper surface of the end connector portion, and wherein the upper surface of the end connector portion is substantially coplanar with the plane of the main surface of the semiconductor die.

15. The semiconductor device of claim 13, wherein the electrically insulating coating layer comprises a solder resist material.

16. A semiconductor device, comprising:
a conductive frame that has a substantially uniform thickness throughout the frame and comprises a die attach surface that is substantially planar;
a semiconductor die comprising a first terminal disposed on a rear surface of the semiconductor die and a second terminal disposed on a main surface of the semiconductor die that is opposite the rear surface;
a first conductive contact structure disposed on the die attach surface with a lateral separation between the first conductive contact structure and the semiconductor die;
a second conductive contact structure on the second terminal of the semiconductor die;
an electrically insulating encapsulant body disposed on the die attach surface, the encapsulant body encapsulating the semiconductor die and surrounding the first and second conductive contact structures,
wherein the semiconductor die is mounted to the die attach surface such that the first terminal faces and is electrically connected to the conductive frame,
wherein the first and second conductive contact structures each comprise a fusible conductive adhesive material, wherein the encapsulant body includes a substantially planar upper surface that is opposite from the die attach surface, wherein the first and second conductive contact structures are each exposed from the upper surface of the encapsulant body, and wherein the exposed portions of the first and second conductive contact structures are spaced apart from an edge side of the encapsulant body by a region of the planar upper surface.

17. The semiconductor device of claim 16, wherein the die attach surface has a greater area than an areal footprint of the semiconductor die, and wherein the semiconductor die is affixed to the die attach surface such that the die attach surface laterally extends past the semiconductor die in every direction.

18. The semiconductor device of claim 17, further comprising a plurality of the first conductive contact structures each being formed on the die attach surface and surrounding one or more sides of the semiconductor die, wherein each of the first conductive contact structures form discrete points of electrical contact to the first terminal.

19. The semiconductor device of 16, further comprising:
an electrically conductive lead frame structure that comprises first and second terminal pads that are spaced apart from one another,
wherein the first terminal pad is adhered to and electrically connected with the first conductive contact structure and the second terminal pad is adhered to and electrically connected with the second conductive contact structure.

20. semiconductor device of claim 16, further comprising:
a circuit board that comprises an electrically insulating substrate and first and second terminal pads that are electrically isolated from one another by the substrate; and
wherein the first terminal pad is adhered to and electrically connected with the first conductive contact structure the second terminal pad is adhered to and electrically connected with the second conductive contact structure.

* * * * *